(12) United States Patent
Song et al.

(10) Patent No.: US 10,700,204 B2
(45) Date of Patent: Jun. 30, 2020

(54) CIRCUITS HAVING A DIFFUSION BREAK WITH AVOIDED OR REDUCED ADJACENT SEMICONDUCTOR CHANNEL STRAIN RELAXATION, AND RELATED METHODS

(71) Applicant: QUALCOMM Incorporated, San Diego, CA (US)

(72) Inventors: Stanley Seungchul Song, San Diego, CA (US); Kern Rim, San Diego, CA (US); Da Yang, San Diego, CA (US); Peijie Feng, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/104,522

(22) Filed: Aug. 17, 2018

(65) Prior Publication Data

US 2020/0058792 A1 Feb. 20, 2020

(51) Int. Cl.
| | | |
|---|---|---|
| *H01L 29/78* | (2006.01) | |
| *H01L 29/06* | (2006.01) | |
| *H01L 27/092* | (2006.01) | |
| *H01L 29/66* | (2006.01) | |
| *H01L 29/423* | (2006.01) | |
| *H01L 21/8238* | (2006.01) | |
| *H01L 29/165* | (2006.01) | |

(52) U.S. Cl.
CPC .. *H01L 29/7849* (2013.01); *H01L 21/823807* (2013.01); *H01L 27/0924* (2013.01); *H01L 29/0653* (2013.01); *H01L 29/165* (2013.01); *H01L 29/42392* (2013.01); *H01L 29/66545* (2013.01)

(58) Field of Classification Search
None
See application file for complete search history.

(56) References Cited

U.S. PATENT DOCUMENTS

| 9,570,442 B1* | 2/2017 | Liu ..................... H01L 29/0649 |
| 9,721,793 B2 | 8/2017 | Smith et al. |
| 9,917,103 B1 | 3/2018 | Mulfinger et al. |
| 10,134,734 B2* | 11/2018 | Yuan ..................... H01L 21/762 |
| 10,475,693 B1* | 11/2019 | Shu .................... H01L 29/66795 |
| 2014/0027860 A1* | 1/2014 | Glass ............. H01L 21/823807 257/401 |
| 2016/0093511 A1 | 3/2016 | Sengupta et al. |

(Continued)

*Primary Examiner* — David E Graybill
(74) *Attorney, Agent, or Firm* — W&T/Qualcomm

(57) ABSTRACT

Cell circuits having a diffusion break with avoided or reduced adjacent semiconductor channel strain relaxation and related methods are disclosed. In one aspect, a cell circuit includes a substrate of semiconductor material and a semiconductor channel structure(s) of a second semiconductor material disposed on the substrate. The semiconductor material applies a stress to the formed semiconductor channel structure(s) to induce a strain in the semiconductor channel structure(s) for increasing carrier mobility. A diffusion break comprising a dielectric material extends through a surrounding structure of an interlayer dielectric, and the semiconductor channel structure(s) and at least a portion of the substrate. The relaxation of strain in areas of the semiconductor channel structure(s) adjacent to the diffusion break is reduced or avoided, because the semiconductor channel structure(s) is constrained by the surrounding structure.

25 Claims, 14 Drawing Sheets

(56) References Cited

U.S. PATENT DOCUMENTS

| | | | |
|---|---|---|---|
| 2017/0062475 A1* | 3/2017 | Song | H01L 28/00 |
| 2017/0338229 A1* | 11/2017 | Oh | H01L 21/823821 |
| 2017/0358565 A1* | 12/2017 | Hensel | H01L 27/0207 |
| 2018/0006035 A1* | 1/2018 | Yuan | H01L 29/0649 |
| 2018/0053761 A1 | 2/2018 | Liou et al. | |
| 2018/0083036 A1 | 3/2018 | Agarwal et al. | |
| 2018/0090494 A1* | 3/2018 | Chao | H01L 21/823821 |
| 2018/0130711 A1* | 5/2018 | Zang | H01L 21/823431 |
| 2018/0158841 A1* | 6/2018 | Glass | H01L 21/845 |
| 2018/0183414 A1* | 6/2018 | Guo | H01L 27/11807 |
| 2018/0374851 A1* | 12/2018 | Wang | H01L 21/823821 |
| 2019/0027602 A1* | 1/2019 | Lee | H01L 27/0924 |
| 2019/0148242 A1* | 5/2019 | Zang | H01L 27/0886 |
| | | | 257/401 |
| 2019/0148373 A1* | 5/2019 | Shi | H01L 29/0649 |
| | | | 257/401 |
| 2019/0220568 A1* | 7/2019 | Ryu | H01L 27/11807 |

* cited by examiner

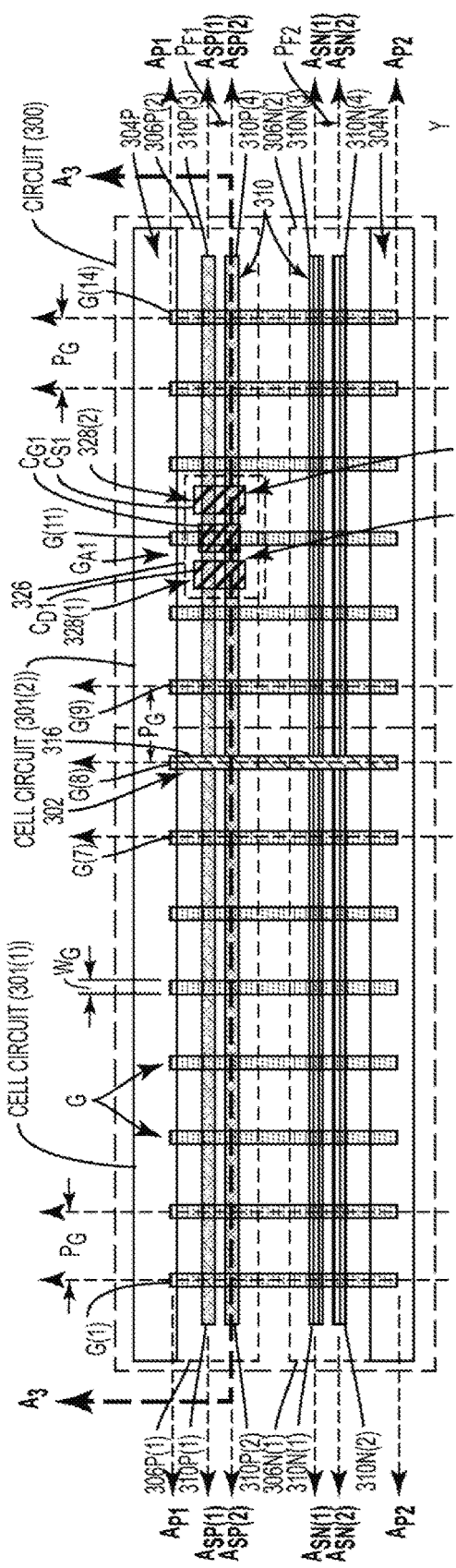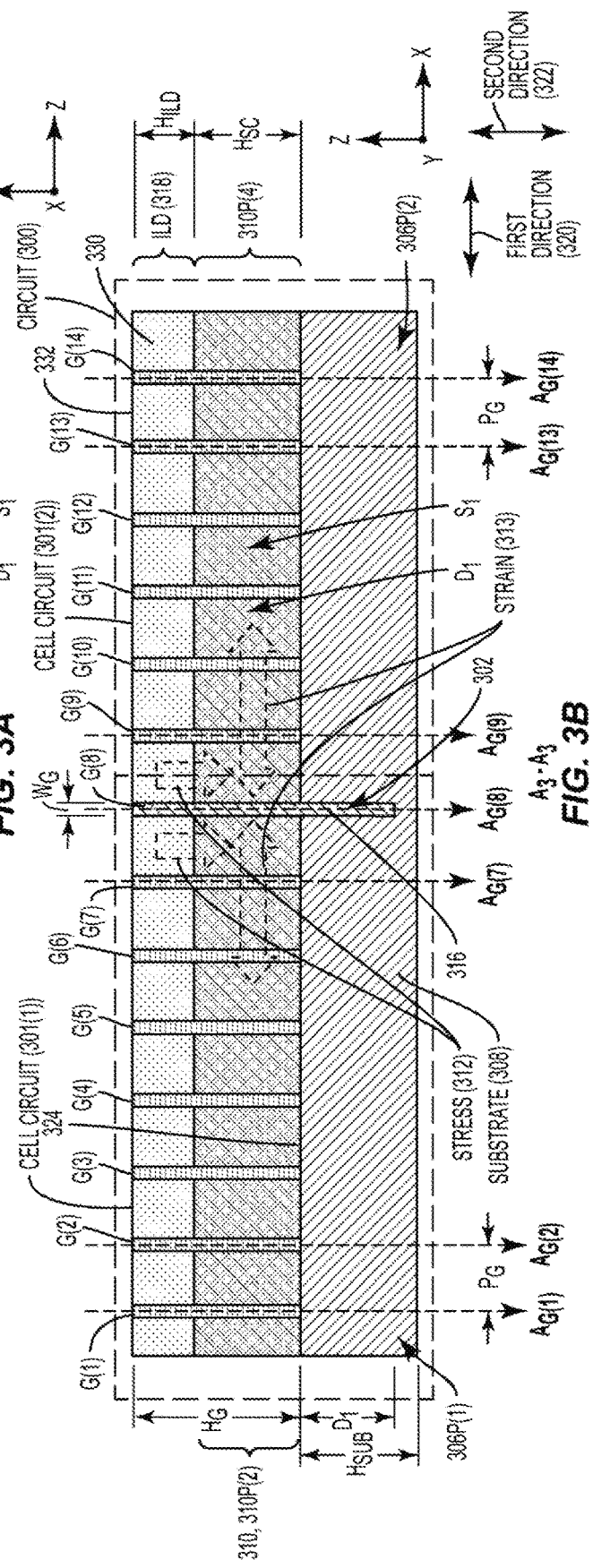
FIG. 3A
FIG. 3B

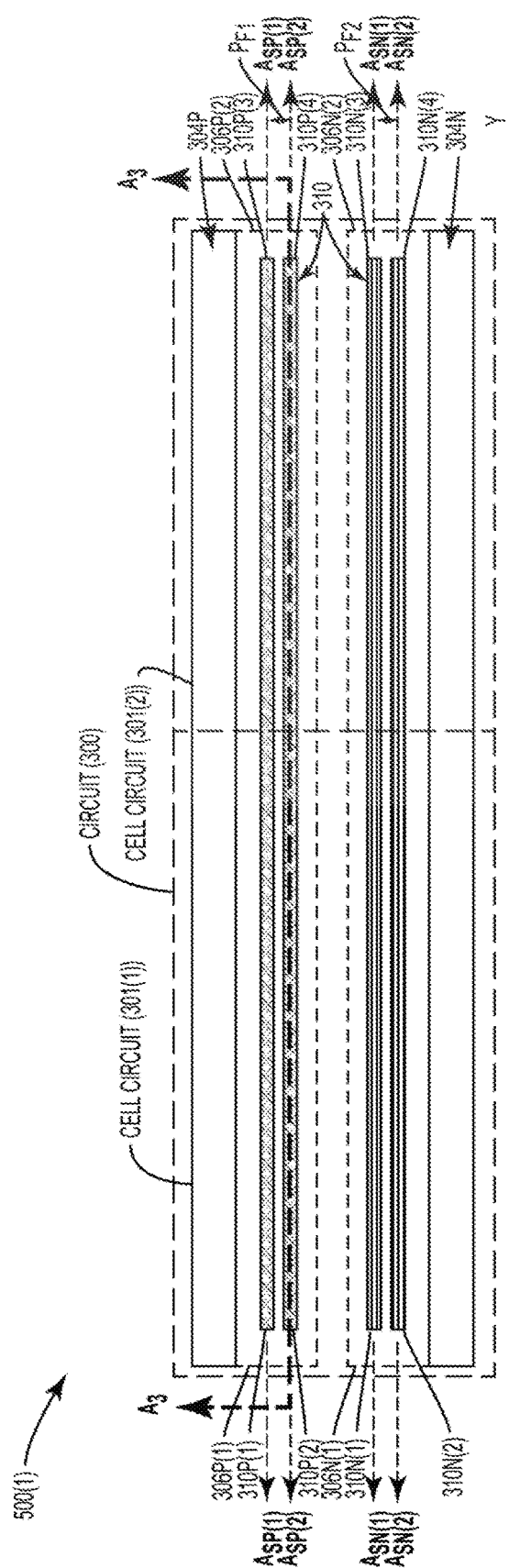
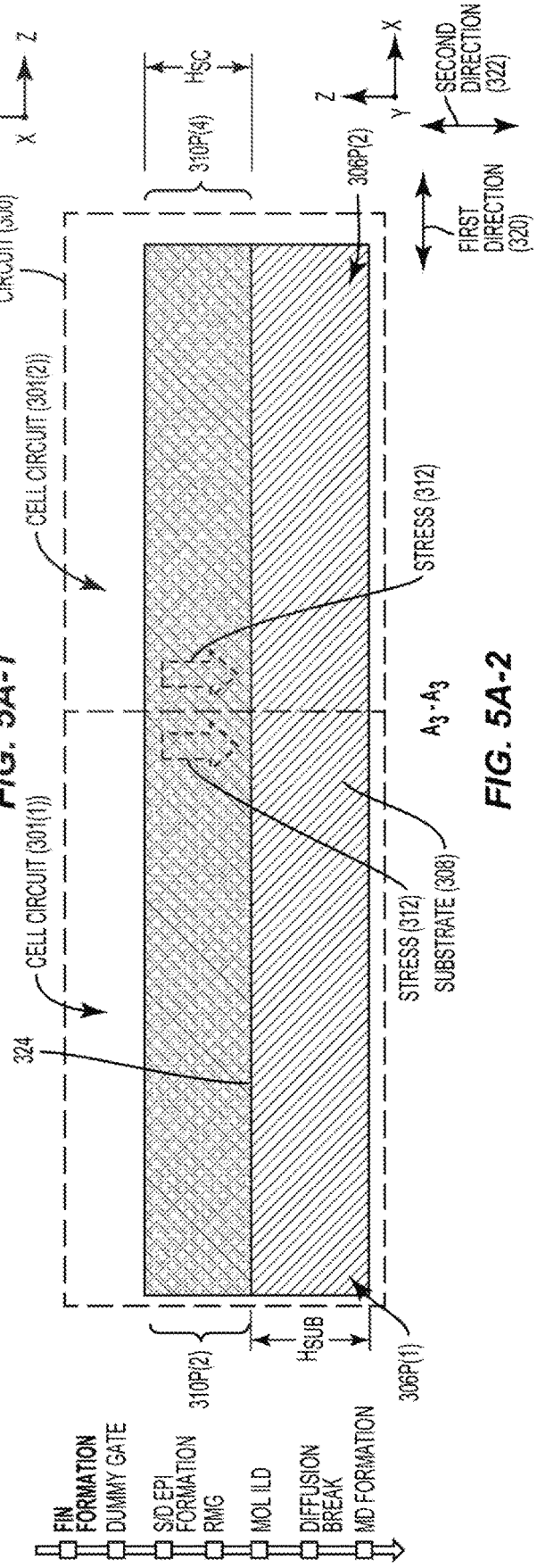
FIG. 5A-1
FIG. 5A-2

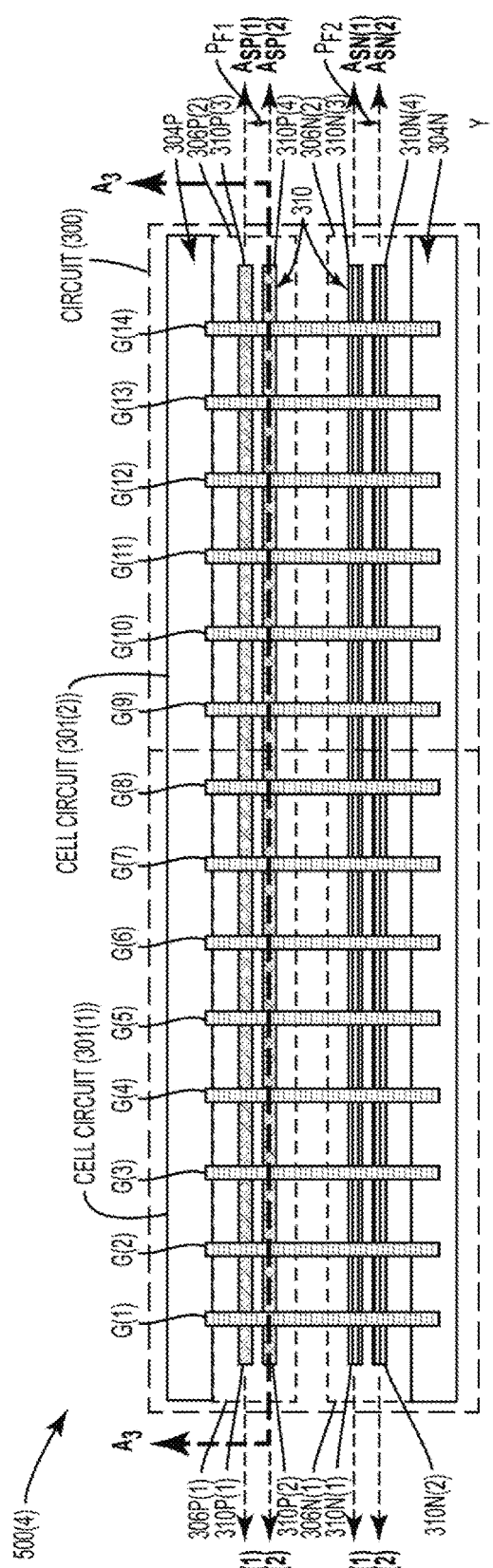
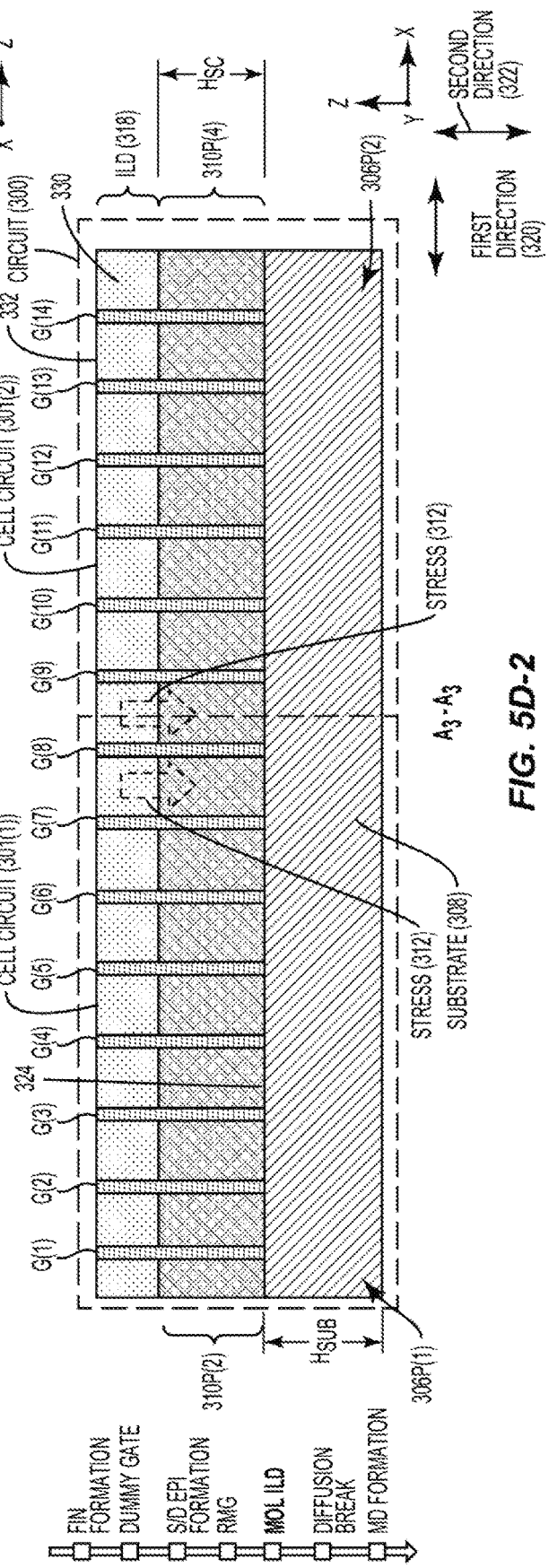
FIG. 5D-1
FIG. 5D-2

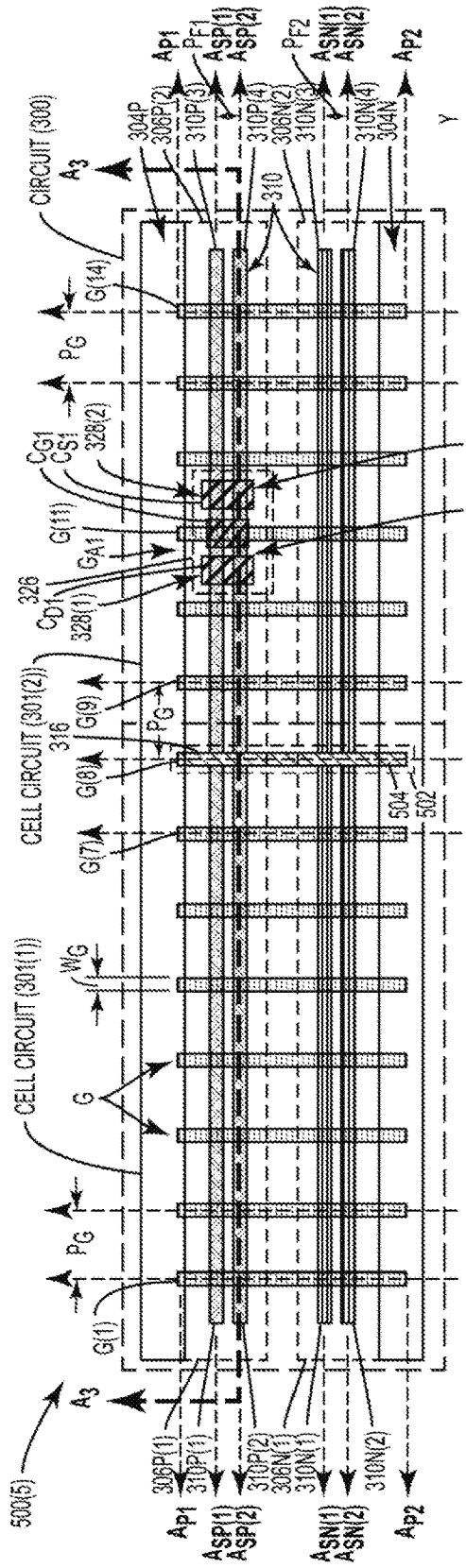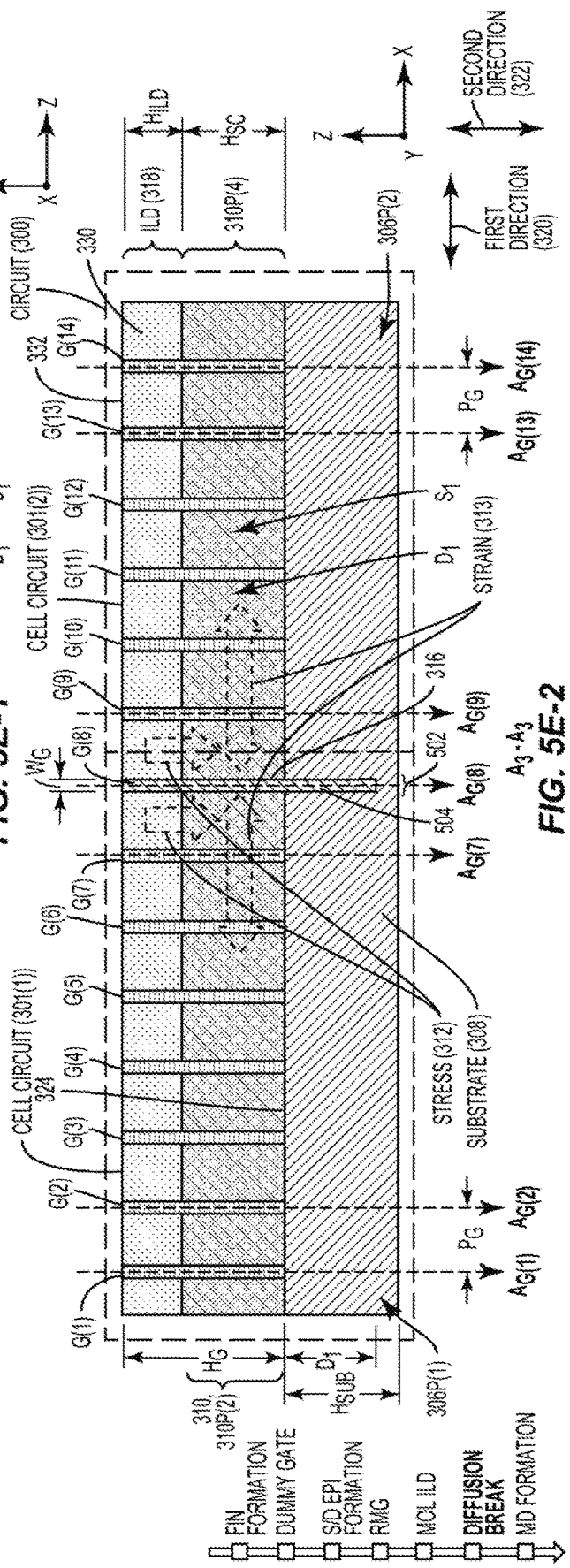

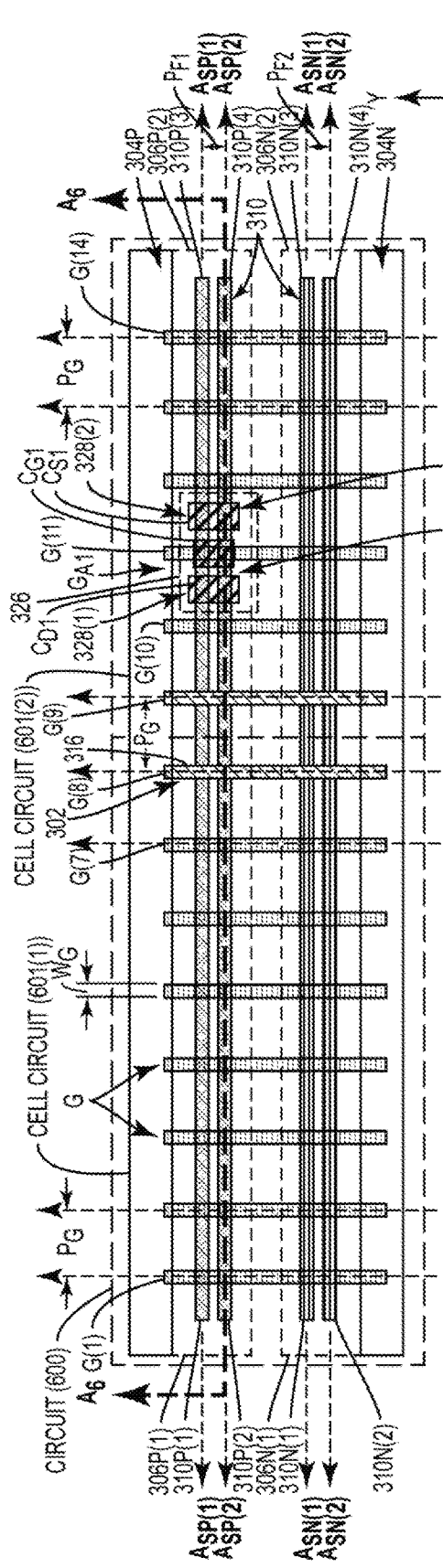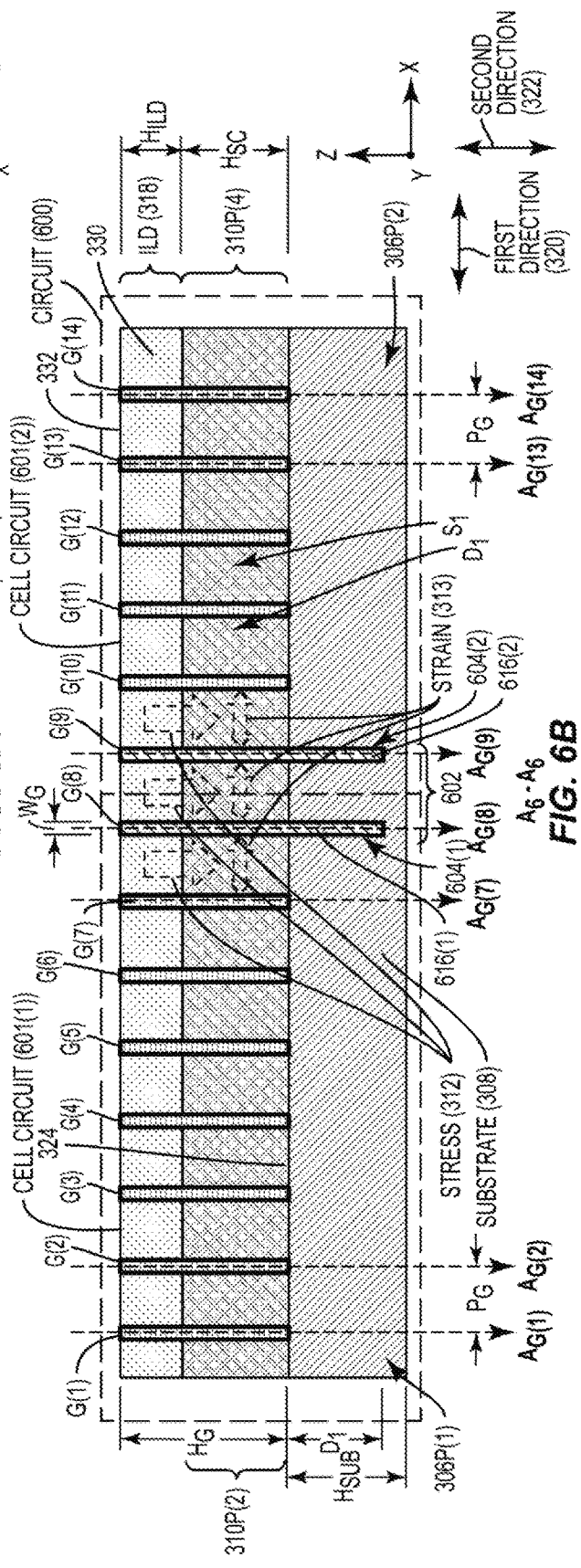
FIG. 6A
FIG. 6B

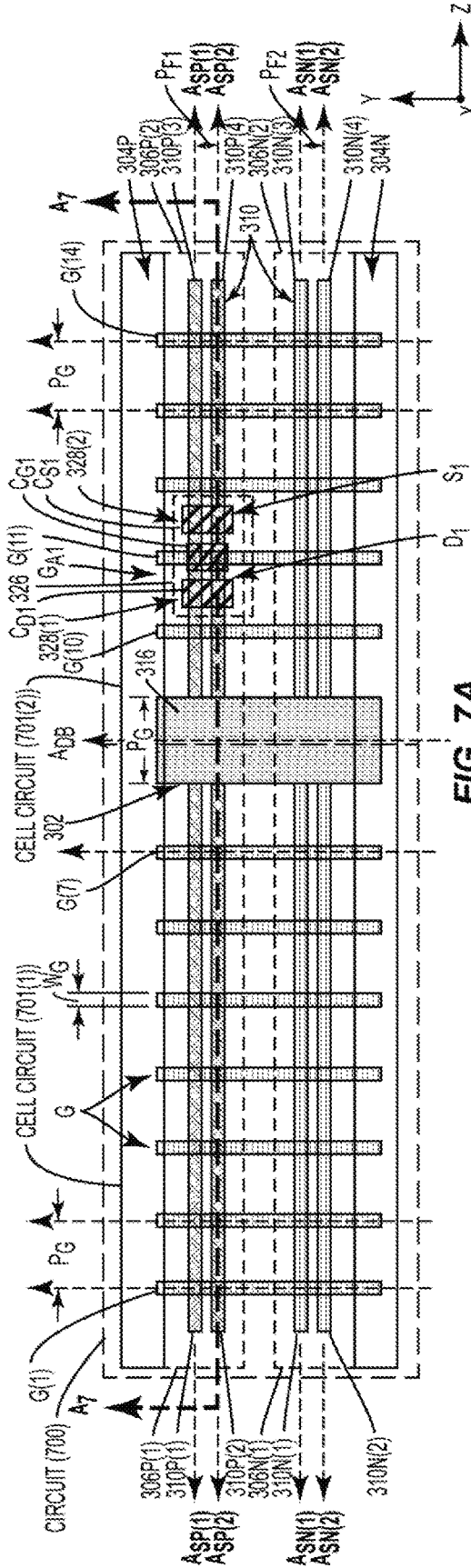
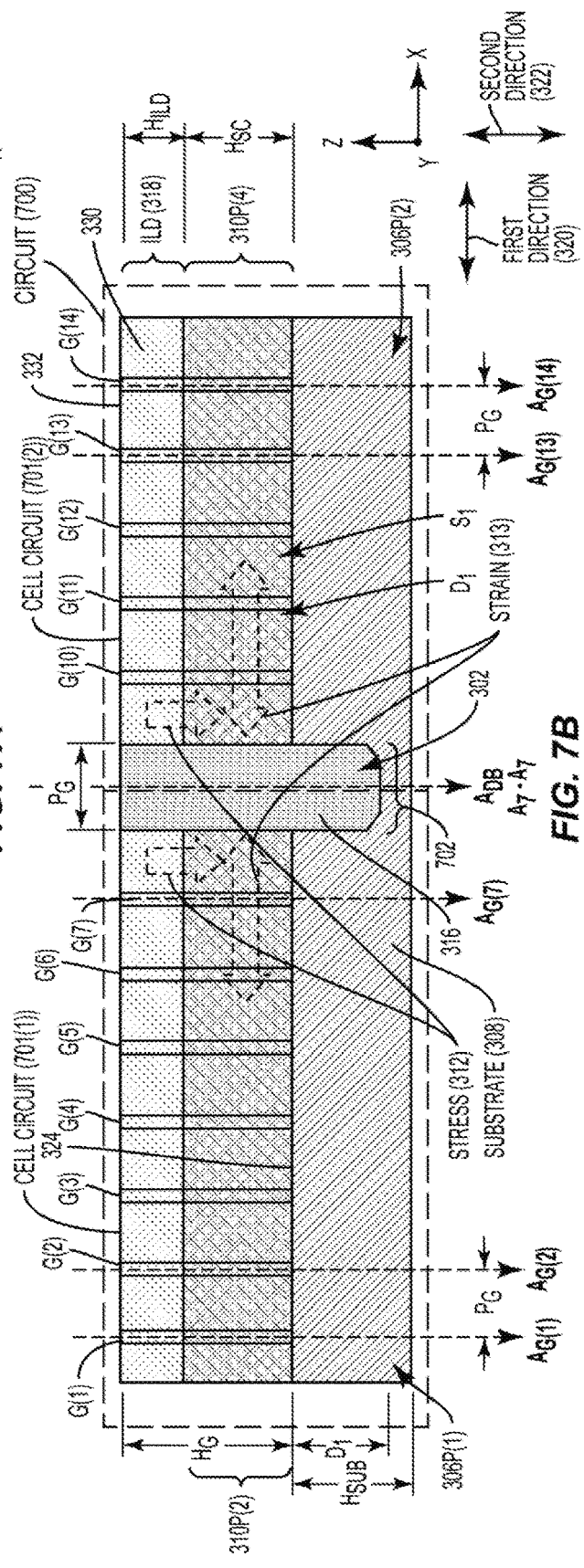
FIG. 7A
FIG. 7B

US 10,700,204 B2

CIRCUITS HAVING A DIFFUSION BREAK WITH AVOIDED OR REDUCED ADJACENT SEMICONDUCTOR CHANNEL STRAIN RELAXATION, AND RELATED METHODS

BACKGROUND

I. Field of the Disclosure

The field of the disclosure relates to transistors, such as Fin Field-Effect Transistors (FETs) (FinFETs) in integrated circuits (ICs), and more particularly to application of stress in a semiconductor channel of a transistor to induce strain in the semiconductor channel to increase carrier mobility.

II. Background

Transistors are essential components in modern electronic devices. Large numbers of transistors are employed in integrated circuits (ICs) in many modern electronic devices. For example, components such as central processing units (CPUs), digital signal processors (DSPs), and memory systems each employ a large quantity of transistors for logic circuits and memory devices.

As electronic devices become more complex in functionality, so does the need to include a greater number of transistors in such devices. However, as electronic devices are required to be provided in increasingly smaller packages, such as in mobile devices, for example, there is a need to provide a greater number of transistors in a smaller IC chip. This increase in the number of transistors is achieved in part through continued efforts to miniaturize transistors in ICs (i.e., placing increasingly more transistors into the same amount of space). In particular, node sizes in ICs are being scaled down by a reduction in minimum metal line width in the ICs (e.g., 65 nanometers (nm), 45 nm, 28 nm, 20 nm, etc.). As a result, the gate lengths of planar transistors are also scalably reduced, thereby reducing the channel length of the transistors and interconnects. Reduced channel length in planar transistors has the benefit of increasing drive strength (i.e., increased drain current) and providing smaller parasitic capacitances resulting in reduced circuit delay. However, as channel length in planar transistors is reduced such that the channel length approaches a magnitude similar to depletion layer widths, short channel effects (SCEs) can occur that degrade performance. More specifically, SCEs in planar transistors cause increased current leakage, reduced threshold voltage, and/or threshold voltage roll-off (i.e., reduced threshold voltage at shorter gate lengths).

In this regard, to address the need to scale down channel lengths in transistors while avoiding or mitigating SCEs, transistor designs alternative to planar transistors have been developed. One such alternative transistor design includes a Fin Field-Effect Transistor (FET) (FinFET) that provides a conducting channel via a "Fin" formed from a substrate. Material is wrapped around the Fin to form a gate of the FinFET. For example, FIG. 1 illustrates an exemplary Fin-FET 100. The FinFET 100 includes a substrate 102 and a Fin 104 formed above the substrate 102. The Fin 104 is formed from a semiconductor material. The Fin 104 may be formed from a semiconductor substrate 102 by lithography and etching processes to form raised Fins 104 from the semiconductor material of the substrate 102. An oxide layer 106 is included on either side of the Fin 104. The FinFET 100 includes a source 108 and a drain 110 interconnected by the Fin 104 such that an interior portion of the Fin 104 serves as a semiconductor channel 112 ("channel 112") between the source 108 and drain 110. The Fin 104 is surrounded by a "wrap-around" gate 114. The wrap-around structure of the gate 114 provides better electrostatic control over the channel 112, and thus helps reduce leakage current and overcoming other SCEs.

Although a FinFET, such as the FinFET 100 in FIG. 1, reduces leakage current and avoids or mitigates SCEs as compared to planar transistors, ICs employing FinFETs continue to require increased performance. One way to achieve increased performance in a FET, including the FinFET 100, is to apply stress to the channel 112 so as to alter carrier mobility within the channel 112. For example, stress 116 applied to the channel 112 of the FinFET 100 employed as an N-type FinFET causes corresponding electrons to flow more easily. Further, stress 116 applied to the channel 112 of the FinFET 100 employed as a P-type FinFET causes corresponding holes to flow more easily. In either case, stress 116 applied to the channel 112 is designed to change the carrier mobility so as to increase conductance in the channel 112, thus increasing performance of the corresponding FinFET 100. The stress 116 is achieved by applying compressive or tensile pressure on the channel 112. Conventional methods to apply the stress 116 are more complex and less effective when employed with FinFETs, such as the FinFET 100. For example, the stress 116 can be applied to the channel 112 in the FinFET 100 in FIG. 1 by growing epitaxial layers (not shown) corresponding to the source 108 and the drain 110, or by altering the composition of isolation trenches (not shown) separating the FinFET 100 from other devices. Tensile stress can be applied in the channel 112 of the FinFET 100 to induce channel strain to improve carrier mobility for N-type FinFETs. Compressive stress can be applied in the channel 112 of the FinFET 100 to induce channel strain to improve carrier mobility for P-type FinFETs.

FIG. 2A is a top view of a circuit 200 that includes adjacent cell circuits 201(1), 201(2), which are each an IC, that support the formation of semiconductor devices, such as the FinFET 100 in FIG. 1. FIG. 2B is a cross-sectional side view of the cell circuits 201(1), 201(2) across an $A_2$-$A_2$ break line. The individual cell circuits 201(1), 201(2) are isolated from each other by a diffusion break 202. As shown in FIG. 2A, the cell circuits 201(1), 201(2) include a layout on X-axis and Y-axis dimensions that includes a shared top power rail 204P and a shared bottom power rail 204N elongated in a direction of the X-axis. The cell circuits 201(1), 201(2) include respective P-type doped semiconductor diffusion regions ("P-type diffusion regions") 206P(1), 206P(2) and N-type doped semiconductor diffusion regions ("N-type diffusion regions") 206N(1), 206N(2) formed in a substrate 208 (e.g., a Silicon (Si) material layer), as shown in FIG. 2B, to provide active areas for forming semiconductor devices, such as transistors. The diffusion break 202 is needed when a different bias voltage is applied to the respective P-type or N-type diffusion region 206P(1), 206P(2) and/or 206N(1), 206N(2); otherwise, electrical isolation is needed. The P-type diffusion regions 206P(1), 206P(2) are formed as one diffusion region, but are isolated by the diffusion break 202. Likewise, the N-type diffusion regions 206N(1), 206N(2) are formed as one diffusion region, but are isolated by the diffusion break 202. The cell circuits 201(1), 201(2) also include respective P-type semiconductor channel structures 210P(1)-210P(4) and N-type semiconductor channel structures 210N(1)-210N(4) formed from semiconductor materials between the top and bottom power rails 204P, 204N. For example, the P-type and N-type semiconductor channel structures 210P(1)-210P(4), 210N (1)-210N(4) may be semiconductor Fins, also known as "Fins" for forming three-dimensional (3D) channel structures. The respective P-type semiconductor channel structures 210P(1), 210P(2) and 210P(3), 210P(4), and the respective N-type semiconductor channel structures 210N(1), 210N(2) and 210N(3), 210N(4) were originally formed as single semiconductor channel structures, but are isolated by the diffusion break 202. As an example, the P-type semiconductor channel structures 210P(1), 210P(2) may be formed from a Silicon Germanium (SiGe) material disposed on the substrate 208 such that a stress 212 is induced in the P-type semiconductor channel structures 210P(1)-210P(4), as shown in FIG. 2B, to strain the P-type semiconductor channel structures 210P(I)-210P(4). This improves carrier mobility in the P-type semiconductor channel structures 210P(1)-210P(4). Gates G(1)-G(14) of a metal material are formed in the cell circuits 201(1), 201(2) and elongated in the direction of the Y-axis extending around at least a portion of the P-type and N-type semiconductor channel structures 210P(1)-210P(4), 210N(1)-210N(4). In this manner, active gates for semiconductor devices such as transistors can be formed in areas of the gates G(1)-G(14) that surround the P-type and N-type semiconductor channel structures 210P(1)-210P(4), 210N(1)-210N(4) to form semiconductor channels. An interlayer dielectric (ILD) 213 is disposed above the gates G(1)-G(14) and the P-type and N-type semiconductor channel structures 210P(1)-210P(4), 210N(1)-210N(4) to provide further electrical isolation.

With continuing reference to FIGS. 2A and 2B, the diffusion break 202 is formed by a cut process whereby the P-type and N-type semiconductor channel structures 210P(1)-210P(4), 210N(I)-210N(4) are cut after being formed, and before the gates G(1)-G(14) and the interlayer dielectric 213 are formed in the cell circuits 201(1), 201(2). This is so that the P-type and N-type semiconductor channel structures 210P(1)-210P(4), 210N(1)-210N(4) can be originally patterned and formed uniformly with the predefined number of Fins according to desired Fin pitch to avoid or reduce non-uniformities that may result in variations in channel performance beyond design parameters. After the P-type and N-type semiconductor channel structures 210P(1)-210P(4), 210N(1)-210N(4) are patterned and formed, a process is performed wherein an opening is formed above the area of the P-type and N-type semiconductor channel structures 210P(1)-210P(4), 210N(1)-210N(4) to be cut. The material of the P-type and N-type semiconductor channel structures 210P(1)-210P(4), 210N(1)-210N(4) below the opening can be removed (e.g., etched) down into the substrate 208 to form an opening 214. A dielectric material 216 is filled in the opening 214 to isolate the cell circuits 201(1), 201(2) forming the diffusion break 202. The gates G(8), G(9) immediately adjacent to the diffusion break 202 are dummy gates meaning active gates are not formed in these gates G(8), G(9) because of the diffusion break 202. Cutting the P-type semiconductor channel structures 210P(1)-210P(4) may alter the stress 212 applied in the P-type semiconductor channel structures 210P(1)-210P(4), thus altering the strain behavior in the P-type semiconductor channel structures 210P(1)-210P(4) leading to significant device behavior modulation, known as local layout effect (LLE) and length of oxide definition (LOD) effect. The effect of any strain relaxation in the P-type semiconductor channel structures 210P(1)-210P(4) will decrease as a function of increased distance from the diffusion break 202. Thus, additional dummy gates could be included in the cell circuits 201(1), 201(2), such as gates G(7), G(10) adjacent respective gates G(8), G(9), so that active semiconductor devices are not formed with areas of the P-type semiconductor channel structures 210P(1)-210P(4) where strain relaxation may be present or significant. However, this results in an area penalty where either a reduced number of gates are available to form active semiconductor devices, or the area of the cell circuits 201(1), 202(2) needs to be increased to provide for more active gates.

SUMMARY OF THE DISCLOSURE

Aspects disclosed herein include circuits having a diffusion break with avoided or reduced adjacent semiconductor channel strain relaxation. Related methods are also disclosed. In this manner, as an example, semiconductor devices formed in the circuits can avoid or reduce a decrease in carrier mobility as a result of forming the diffusion break. For example, the circuit may be a cell circuit that is formed from a cell layout such as a standard cell layout that includes both P-type and N-type diffusion regions for forming complementary metal-oxide (CMOS) circuits. The cell circuits may be fabricated to include semiconductor devices, such as planar Field-Effect Transistors (FETs) and three-dimensional (3D) FETs, such as FinFETs and gate-all-around (GAA) FETs. In this regard, in exemplary aspects disclosed herein, a cell circuit includes a substrate of a first semiconductor material (e.g., Silicon (Si)) and one or more semiconductor channel structures of a second semiconductor material (e.g., Silicon Germanium (SiGe)) disposed on a substrate. The semiconductor material of the semiconductor channel structures disposed on the substrate applies a stress to the semiconductor channel structures to induce a strain in the semiconductor channel structures due to a lattice mismatch between the first semiconductor material and the second semiconductor material for increasing carrier mobility. An interlayer dielectric (ILD) is disposed as a surrounding structure above and/or around the semiconductor channel structures and the substrate. A diffusion break comprising a dielectric material extends through the interlayer dielectric, the semiconductor channel structure(s), and at least a portion of the substrate. For example, to form the diffusion break, at least one gate formed in the cell circuit and at least partially surrounded by an interlayer dielectric as surrounding structures is removed and filled with a dielectric material in the cell circuit. The relaxation of strain in areas of the semiconductor channel structures adjacent to the diffusion break can be reduced or avoided, because the semiconductor channel structures are constrained by the surrounding structure. In this manner, the cell circuit can include a diffusion break while potentially avoiding a substantial reduction in carrier mobility and/or having to include dummy gates adjacent to the diffusion break to avoid channels of active semiconductor devices being formed from portions of the semiconductor channel structures having relaxed strain.

In this regard, in one exemplary aspect, a circuit is provided. The circuit comprises a substrate comprising a top surface. The circuit also comprises a first cell circuit. The first cell circuit comprises a first diffusion region disposed above the substrate. The first diffusion region comprises at least one first semiconductor channel structure each having a longitudinal axis in a first direction and disposed on the top surface of the substrate, and each induces a strain in at least a portion of the at least one first semiconductor channel structure. The first cell circuit also comprises at least one first gate each having a longitudinal axis in a second direction substantially orthogonal to the first direction and disposed above the at least one first semiconductor channel structure. The circuit also comprises a second cell circuit. The second cell circuit comprises a second diffusion region disposed above the substrate. The second diffusion region comprises at least one second semiconductor channel structure having a longitudinal axis in the first direction and disposed on the top surface of the substrate, and each induces a strain in at least a portion of the at least one second semiconductor channel structure. The second cell circuit also comprises at least one second gate each having a longitudinal axis in the second direction and disposed above the at least one second semiconductor channel structure. The circuit also comprises an interlayer dielectric disposed above the least one first semiconductor channel structure, the at least one second semiconductor channel structure, the at least one first gate, and the at least one second gate, wherein the interlayer dielectric comprises a top surface. The circuit also comprises a diffusion break disposed between the first diffusion region and the second diffusion region. The diffusion break comprises a dielectric material extending along a longitudinal axis in the second direction at the top surface of the interlayer dielectric, through the interlayer dielectric, and through at least a portion of the substrate.

In another exemplary aspect, a circuit is provided. The circuit comprises a substrate comprising a top surface. The circuit also comprises at least one means for inducing a strain in at least a portion of at least one first semiconductor channel structure in a first diffusion region. The circuit also comprises at least one means for inducing a strain in at least a portion of at least one second semiconductor channel structure in a second diffusion region. The circuit also comprises a means for insulating the at least one means for inducing the strain in the at least a portion of the at least one first semiconductor channel structure and the at least one means for inducing the strain in the at least a portion of the at least one second semiconductor channel structure. The circuit also comprises a means for isolating the first diffusion region from the second diffusion region in a diffusion break.

In another exemplary aspect, a method of fabricating a circuit comprising a first cell circuit and a second cell circuit is provided. The method comprises forming a substrate from a first material, the substrate comprising a top surface. The method also comprises forming at least one semiconductor channel structure each having a longitudinal axis in a first direction on the top surface of the substrate in a diffusion region to induce a strain in at least a portion of the at least one semiconductor channel structure. The method also comprises forming a plurality of dummy gates above the at least one semiconductor channel structure, each of the plurality of dummy gates having a longitudinal axis in a second direction substantially orthogonal to the first direction. The method also comprises replacing the plurality of dummy gates with a respective plurality of gates. The method also comprises disposing an interlayer dielectric material above the at least one semiconductor channel structure and the plurality of gates to form an interlayer dielectric, the interlayer dielectric comprising a top surface. The method also comprises forming an opening above at least one gate among the plurality of gates, in the top surface of the interlayer dielectric, through the interlayer dielectric, and a portion of the at least one semiconductor channel structure disposed below the at least one gate to at least a portion of the substrate. The method further comprises removing the at least one gate below the opening between the top surface of the interlayer dielectric and the at least a portion of the substrate to form a cavity. The method also comprises disposing a dielectric material in the opening to form a diffusion break in the cavity.

BRIEF DESCRIPTION OF THE FIGURES

FIGS. 3A and 3B are respective top and cross-sectional side views of an exemplary circuit that includes adjacent cell circuits each having semiconductor channel structures (e.g., Fins) and active gates disposed around the semiconductor channel structures for forming semiconductor devices, wherein the cell circuits are isolated by a single diffusion break formed from a dielectric material disposed in a removed gate, wherein the diffusion break extends through a surrounding interlayer dielectric, the semiconductor channel structure(s), and at least partially through a substrate to reduce or avoid strain relaxation in an adjacent semiconductor channel structure(s);

FIGS. 5A-1 and 5A-2 illustrate a top and cross-sectional side view, respectively, of a first exemplary fabrication stage of semiconductor channel formation in the fabrication of the circuit in FIGS. 3A and 3B according to the exemplary process in FIG. 4;

FIGS. 5B-1 and 5B-2 illustrate a top and cross-sectional side view, respectively, of a second exemplary fabrication stage of dummy gate formation in the circuit in FIGS. 3A and 3B according to the exemplary process in FIG. 4;

FIGS. 5C-1 and 5C-2 illustrate a top and cross-sectional side view, respectively, of a third exemplary fabrication stage of source/drain formation in the circuit in FIGS. 3A and 3B according to the exemplary process in FIG. 4;

FIGS. 5D-1 and 5D-2 illustrate a top and cross-sectional side view, respectively, of a fourth exemplary fabrication stage of metal gate formation and interlayer dielectric deposition in the circuit in FIGS. 3A and 3B according to the exemplary process in FIG. 4;

FIGS. 5E-1 and 5E-2 illustrate a top and cross-sectional side view, respectively, of a fifth exemplary fabrication stage of diffusion break formation in the circuit in FIGS. 3A and 3B according to the exemplary process in FIG. 4 by removing a dummy gate and filling the removed gate area with a dielectric material to reduce or prevent strain relaxation in a semiconductor channel structure(s) adjacent to the diffusion break;

FIGS. 6A and 6B are respective top and cross-sectional side views of an alternative exemplary circuit that includes adjacent cell circuits each having semiconductor channel structures (e.g., Fins) and active gates disposed around the semiconductor channel structures, wherein the cell circuits are isolated by a double diffusion break formed from a dielectric material disposed in two (2) removed adjacent dummy gates, wherein the double diffusion break extends through a surrounding interlayer dielectric, semiconductor channel structure(s), and at least partially through a substrate to reduce or avoid strain relaxation in an adjacent semiconductor channel structure(s);

FIGS. 7A and 7B are respective top and cross-sectional side views of another alternative exemplary circuit that includes adjacent cell circuits each having semiconductor channel structures (e.g., Fins) and active gates disposed around the semiconductor channel structures, wherein the cell circuits are isolated by a double diffusion break formed from a dielectric material disposed in two (2) removed gates and semiconductor channel structure(s) disposed between the two (2) dummy gates, wherein the double diffusion break extends through a surrounding interlayer dielectric, semiconductor channel structure(s), and at least partially through a substrate to reduce or avoid strain relaxation in an adjacent semiconductor channel structure(s);

DETAILED DESCRIPTION

Figure 1:
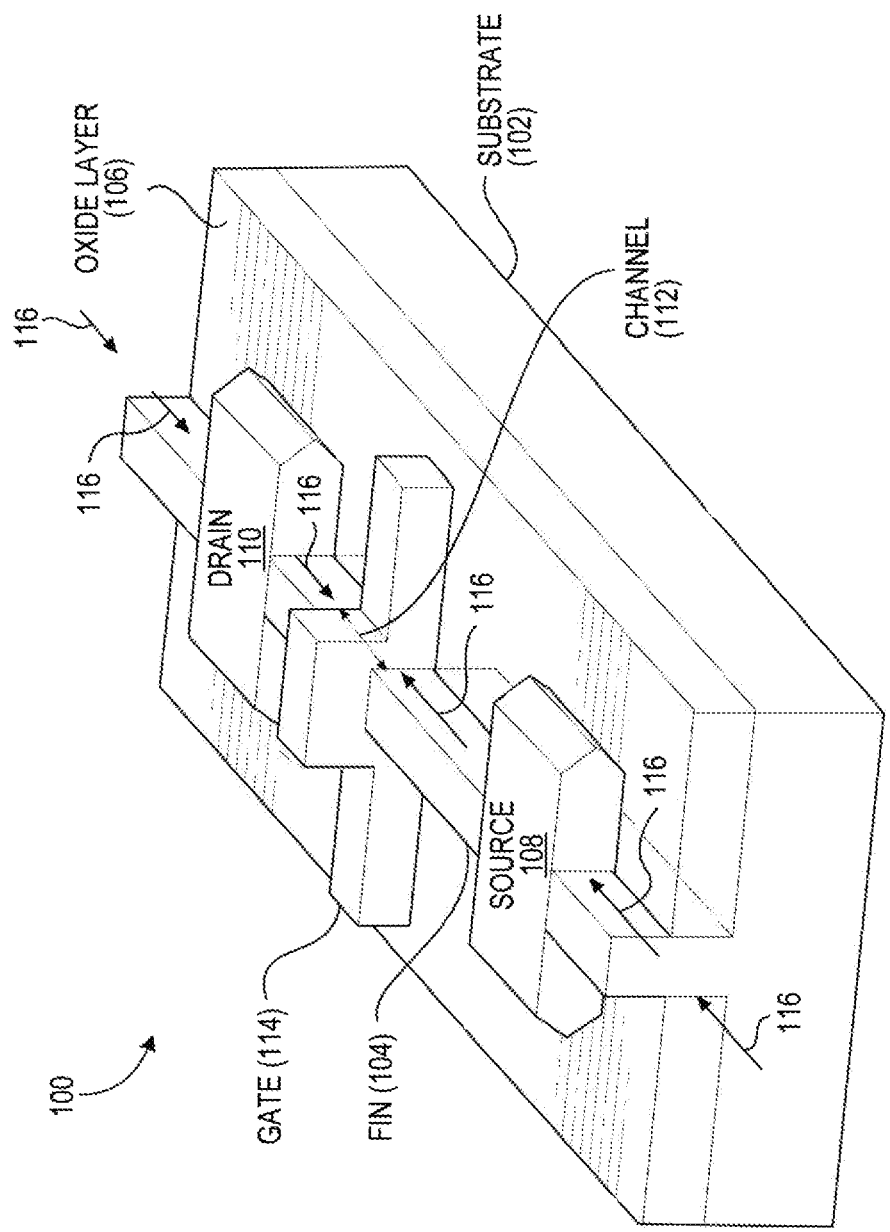
FIG. 1 is a perspective view of an exemplary Fin Field-Effect Transistor (FET) (FinFET)
Figure 2A:
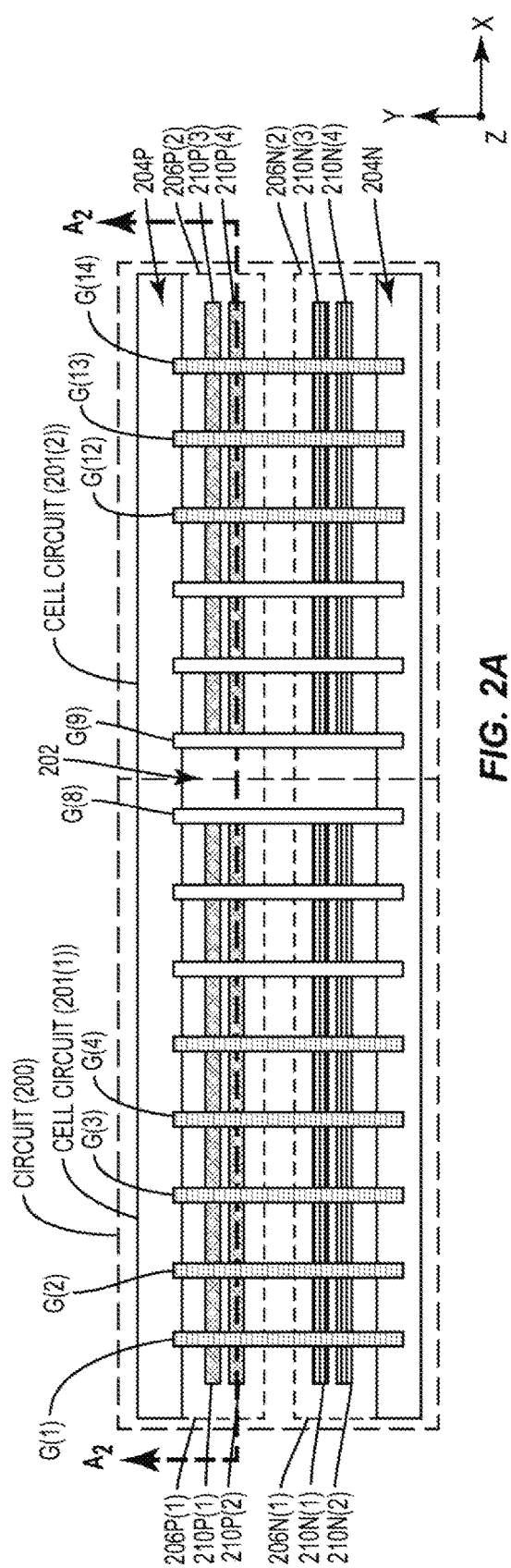
FIGS. 2A and 2B are respective top and cross-sectional side views of cell circuits isolated by a diffusion break formed by a Fin cut of semiconductor Fins ("Fins") formed from a strained semiconductor material filled with a dielectric material, wherein the Fin cut relaxes strain in the Fins adjacent to the diffusion break due to the local layout effect.
Figure 2B:
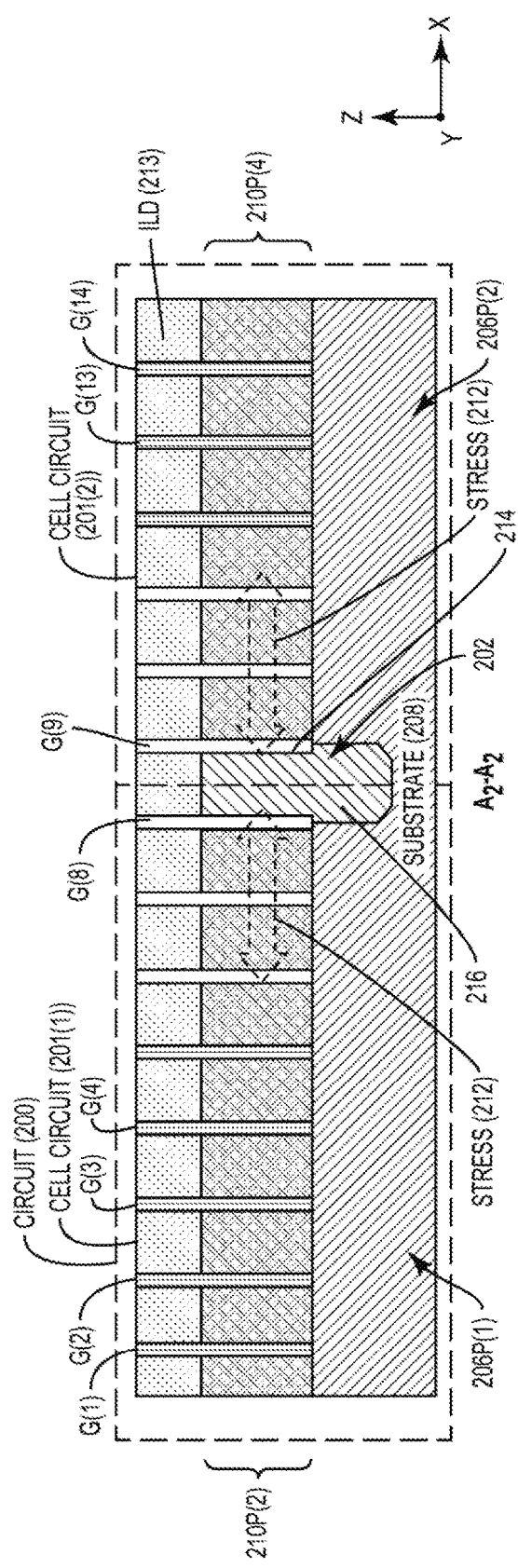

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include circuits having a diffusion break with avoided or reduced adjacent semiconductor channel strain relaxation. Related methods are also disclosed. In this manner, as an example, semiconductor devices formed in the circuits can avoid or reduce a decrease in carrier mobility as a result of forming the diffusion break. For example, the circuit may be a cell circuit that is formed from a cell layout such as a standard cell layout that includes both P-type and N-type diffusion regions for forming complementary metal-oxide (CMOS) circuits. The cell circuits may be fabricated to include semiconductor devices, such as planar Field-Effect Transistors (FETs) and three-dimensional (3D) FETs, such as FinFETs and gate-all-around (GAA) FETs. In this regard, in exemplary aspects disclosed herein, a cell circuit includes a substrate of a first semiconductor material (e.g., Silicon (Si)) and one or more semiconductor channel structures of a second semiconductor material (e.g., Silicon Germanium (SiGe)) disposed on a substrate. The semiconductor material of the semiconductor channel structures disposed on the substrate applies a stress to the semiconductor channel structures to induce a strain in the semiconductor channel structures due to a lattice mismatch between the first semiconductor material and the second semiconductor material for increasing carrier mobility. An interlayer dielectric (ILD) is disposed as a surrounding structure above and/or around the semiconductor channel structures and the substrate. A diffusion break comprising a dielectric material extends through the interlayer dielectric, the semiconductor channel structure(s), and at least a portion of the substrate. For example, to form the diffusion break, at least one gate formed in the cell circuit and at least partially surrounded by an interlayer dielectric as surrounding structures is removed and filled with a dielectric material in the cell circuit. The relaxation of strain in areas of the semiconductor channel structures adjacent to the diffusion break can be reduced or avoided, because the semiconductor channel structures are constrained by the surrounding structure. In this manner, the cell circuit can include a diffusion break while potentially avoiding a substantial reduction in carrier mobility and/or having to include dummy gates adjacent to the diffusion break to avoid channels of active semiconductor devices being formed from portions of the semiconductor channel structures having relaxed strain.

In this regard, FIG. 3A is a top view of an exemplary circuit 300. FIG. 3B is a cross-sectional side view of the circuit 300 along an $A_3$-$A_3$ line. The circuit 300 is fabricated according to layout of a circuit cell, which is a pre-defined layout of components that are commonly used to fabricate semiconductor circuits, including, but not limited to, diffusion regions, gates, semiconductor channel structures, and metal interconnect lines according to design parameters, including area and node size. In this manner, the circuit cells can facilitate repeated fabrication of circuits in a semiconductor wafer or die. The circuit 300 in FIGS. 3A and 3B includes semiconductor channel structures 310 (e.g., semiconductor Fins) and gates G disposed above the semiconductor channel structures 310 for forming semiconductor devices according to a circuit cell. If the circuit 300 is intended to include three-dimensional (3D) transistors, such as FinFETs or GAA FETs, the gates G may be disposed around at least a portion of the semiconductor channel structures 310 for improved channel control. Separate cell circuits 301(1), 301(2) are formed in the circuit 300 as a result of including a diffusion break 302 in the circuit 300 that isolates regions of the circuit 300. For example, the diffusion break 302 may be included if a design calls for a different bias voltage to be applied to devices formed in each of the cell circuits 301(1), 301(2).

With continuing reference to FIGS. 3A and 3B, stress 312 (shown in FIG. 3B) is applied to the semiconductor channel structures 310 to induce strain 313 in the semiconductor channel structures 310 to increase carrier mobility. In this example, the diffusion break 302 is formed by a dielectric material 316 that extends through an interlayer dielectric 318, the semiconductor channel structures 310, and at least a portion of a substrate 308. In this manner, the relaxation of strain 313 induced in the areas of the semiconductor channel structures 310 adjacent to the diffusion break 302 as a result of the stress 312 applied in the semiconductor channel structures 310 can be reduced or avoided, because the semiconductor channel structures 310 are constrained by the gates G and the interlayer dielectric 318 as surrounding structures. For example, as discussed in more detail below, the diffusion break 302 may be formed after the gates G and interlayer dielectric 318 of the circuit 300 are formed as the surrounding structures, wherein a gate G is then removed and filled with the dielectric material 316 to form the diffusion break 302. In this manner, the circuit 300 can include the diffusion break 302 to isolate the cell circuits 301(1), 301(2) while potentially avoiding a reduction in carrier mobility in the semiconductor channel structures 310. The reduction or avoidance of strain 313 relaxation in the semiconductor channel structures 310 may also avoid the need to include dummy gates in the cell circuits 301(1), 301(2) adjacent to the diffusion break 302, because an active semiconductor device may then be able to use the semiconductor channel structures 310 adjacent to the diffusion break 302.

As shown in FIG. 3A, the cell circuits 301(1), 301(2) in this example are fabricated according to a circuit cell that includes both respective P-type doped semiconductor diffusion regions 306P(1), 306P(2) ("P-type diffusion regions 306P(1), 306P(2)") and N-type doped semiconductor diffusion regions 306N(1), 206N(2) ("N-type diffusion regions 306N(1), 306N(2)"). Including P-type diffusion regions 306P(1), 306P(2) and N-type diffusion regions 306N(1), 306N(2) in the circuit 300 allows the fabrication of P-type and N-type FETs, such as to form complementary metal-oxide semiconductor (CMOS) circuits. The P-type diffusion regions 306P(1), 206P(2) are formed in the circuit 300 according to a circuit cell as one diffusion region, but are isolated by the diffusion break 302. Likewise, the N-type diffusion regions 306N(1), 306N(2) are formed in the circuit 300 according to a circuit cell as one diffusion region, but are isolated by the diffusion break 302. Note that including multiple diffusion regions in the circuit 300 is not required. The cell circuits 301(1), 301(2) include a layout in the X-axis in a first direction 320 and in the Y-axis in a second direction 322 orthogonal to the X-axis. The cell circuits 301(1), 301(2) include a shared top power rail 304P and a shared bottom power rail 304N each having a longitudinal axis $A_{P1}$, $A_{P2}$ in the first direction 320. The cell circuits 301(1), 301(2) include the respective P-type diffusion regions 306P(1), 306P(2) and N-type diffusion regions 306N(1), 306N(2) formed in the substrate 308, as shown in FIG. 3B, to provide active areas for forming semiconductor devices, such as transistors. The P-type diffusion regions 306P(1), 306P(2) and N-type diffusion regions 306N(1), 306N(2) include respective P-type semiconductor channel structures 310P(1)-310P(4) and N-type semiconductor channel structures 310N(1)-310N(4) formed from a semiconductor material between the top and bottom power rails 304P, 304N. The P-type semiconductor channel structures 310P(1)-310P(4) and N-type semiconductor channel structures 310N(1)-310N(4) each have longitudinal axes $A_{SP(1)}$, $A_{SP(2)}$, $A_{SN(1)}$, $A_{SN(2)}$, in the first direction 320 and are fabricated according to a respective pitch $P_{F1}$, $P_{F2}$ according to the circuit cell. The P-type semiconductor channel structures 310P(1)-310P(4) and N-type semiconductor channel structures 310N(1)-310N(4) are fabricated according to a uniform layout to avoid non-uniformities in performance of semiconductor channels formed in the P-type semiconductor channel structures 310P(1)-310P(4) and N-type semiconductor channel structures 310N(1)-310N(4). As an example, the P-type and N-type semiconductor channel structures 310P(1)-310P(4), 310N(1)-310N(4) may be semiconductor Fins, also known as "Fins" for forming three-dimensional (3D) channel structures. The respective P-type semiconductor channel structures 310P(1), 310P(2) and 310P(3), 310P(4) and the respective N-type semiconductor channel structures 310N(1), 310N(2) and 310N(3), 310N(4) are originally formed as a single semiconductor channel structure 310, but are isolated by the diffusion break 302. The P-type semiconductor channel structures 310P(1)-310P(4) and N-type semiconductor channel structures 310N(1)-310N(4) are formed of a height $H_{SC}$ extending above the substrate 308.

With continuing reference to FIGS. 3A and 3B, the P-type and N-type semiconductor channel structures 310P(1)-310P(4), 310N(1)-310N(4) are disposed on a top surface 324 of the substrate 308 in this example. This applies the stress 312 to the P-type and N-type semiconductor channel structures 310P(1)-310P(4), 310N(1)-310N(4) to induce the strain 313 in the P-type and N-type semiconductor channel structures 310P(1)-310P(4), 310N(1)-310N(4) for increased carrier mobility. The strain 313 results from a lattice mismatch between the semiconductor material of the substrate 308 and the semiconductor material of the P-type and N-type semiconductor channel structures 310P(1)-310P(4), 310N(1)-310N(4). For example, the substrate 308 may be Silicon (Si) and the P-type and N-type semiconductor channel structures 310P(1)-310P(4), 310N(1)-310N(4) may be Silicon Germanium (SiGe). The selection of the semiconductor materials for the substrate 308 and the P-type and N-type semiconductor channel structures 310P(1)-310P(4), 310N(1)-310N(4) will induce a certain strain in the P-type and N-type semiconductor channel structures 310P(1)-310P(4), 310N(1)-310N(4). For example, the strain 313 induced in the P-type and N-type semiconductor channel structures 310P(1)-310P(4), 310N(1)-310N(4) may be at least approximately 1 gigapascal (GPa). The strain 313 induced in the P-type and N-type semiconductor channel structures 310P(I)-310P(4), 310N(1)-310N(4) may be between approximately 1 GPa and 3 GPa. As another example, the substrate 308 may be Silicon Germanium (SiGe), and the P-type and N-type semiconductor channel structures 310P(1)-310P(4), 310N(1)-310N(4) may be Silicon (Si). Other Germanium (Ge) alloys may also be employed.

Further, depending on the design, the semiconductor materials of the substrate 308 and the P-type and N-type semiconductor channel structures 310P(1)-310P(4), 310N(1)-310N(4) may be selected such that strain 313 is induced in only the P-type semiconductor channel structures 310P(1)-310P(4) in the P-type diffusion regions 306P(1), 306P(2) without strain being induced in the N-type semiconductor channel structures 310N(1)-310N(4) in the N-type diffusion regions 306N(1), 306N(2). Alternatively, the semiconductor materials of the substrate 308 and the P-type and N-type semiconductor channel structures 310P(1)-310P(4), 310N(1)-310N(4) may be selected such that strain 313 is induced only in the N-type semiconductor channel structures 310N(I)-310N(4) in the N-type diffusion regions 306N(1), 306N(2) without strain being induced in the P-type semiconductor channel structures 310P(1)-310P(4) in the P-type diffusion regions 306P(1), 306P(2). Alternatively, the semiconductor materials of the substrate 308 and the P-type and N-type semiconductor channel structures 310P(1)-310P(4), 310N(1)-310N(4) may be selected such that strain 313 is induced in both the P-type semiconductor channel structures 310P(1)-310P(4) in the P-type diffusion regions 306P(1), 306P(2) and the N-type semiconductor channel structures 310N(1)-310N(4) in the N-type diffusion regions 306N(1), 306N(2).

With continuing reference to FIGS. 3A and 3B, gates G(1)-G(14) of a metal material in this example are formed in the cell circuits 301(1), 301(2) each having a longitudinal axis $A_{G(1)}$-$A_{G(14)}$ in the second direction 322. The gates G(1)-G(14) are each of a height $H_G$ and have a gate pitch $P_G$ according to the layout of a circuit cell. In this example, the gates G(1)-G(14) extend around at least a portion of the P-type and N-type semiconductor channel structures 310P(1)-310P(4), 310N(1)-310N(4) for providing active gates to form 3D FETs, such as FinFETs or GAA FETs. Note however, that the gates G(1)-G(14) may only extend above the P-type and N-type semiconductor channel structures 310P(1)-310P(4), 310N(1)-310N(4) for providing active gates G to form planar FETs. In this manner, active gates for semiconductor devices such as transistors can be formed in areas of the gates G(1)-G(14) to control the electric field in adjacent areas of the P-type and N-type semiconductor channel structures 310P(1)-310P(4), 310N(1)-310N(4) forming semiconductor channels for the semiconductor devices. FIGS. 3A and 3B further illustrate an exemplary semiconductor device 326 that is formed in the circuit 300 in the P-type diffusion region 306P(2) in the cell circuit 301(2) employing a semiconductor channel from the P-type semiconductor channel structure 310P(3) and the gate G(11). As shown therein, a gate contact $C_{G1}$ is formed over a portion of the gate G(11) to form an active gate $G_{A1}$. A source St and a drain $D_1$ are formed in first and second end portions 328(1), 328(2) in the P-type semiconductor channel structure 310P(3) on opposites of the gate G(11) where the gate contact $C_{G1}$ is formed over the gate G(11). Source and drain contacts $C_{D1}$, $C_{S1}$ are formed over the respective source $S_1$ and drain $D_1$.

With continuing reference to FIGS. 3A and 3B, the interlayer dielectric 318 of a dielectric material 330 of height $H_{ILD}$ is disposed above the P-type and N-type semiconductor channel structures 310P(1)-310P(4), 310N(1)-310N(4), and the gates G(1)-G(14) provide electrical isolation between these structures and adjacently form conductive structures and/or interconnect layers formed in metal layers in the circuit 300. The diffusion break 302 included in the circuit 300 to delineate and isolate the cell circuits 301(1), 302(2) is disposed between the P-type and N-type diffusion regions 306P(1), 306N(1) and the P-type and N-type diffusion regions 306P(2), 306N(2). The diffusion break 302 is disposed by a gate pitch $P_G$ distance from gates G(7), G(9) disposed on each side of the diffusion break 302. The diffusion break 302 comprises the dielectric material 316 that extends along a longitudinal axis $A_{G(8)}$ where a gate G(8) was originally formed in the circuit 300. The diffusion break 302 extends along the longitudinal axis $A_{G(8)}$ in the second direction 322 from a top surface 332 of the interlayer dielectric 318 and through the interlayer dielectric 318, the P-type and/or N-type semiconductor channel structures 310P(1)-310P(4), 310N(1)-310N(4) and through a portion of the substrate 308. In this example, the diffusion break 302 extends a depth $D_1$ into the substrate 308 in the second direction 322. In this manner, the relaxation of strain 313 induced in the areas of P-type and/or N-type semiconductor channel structures 310P(1)-310P(4), 310N(1)-310N(4) adjacent to the diffusion break 302 as a result of the stress 312 applied in the P-type and/or N-type semiconductor channel structures 310P(1)-310P(4), 310N(1)-310N(4) can be reduced or avoided, because the P-type and/or N-type semiconductor channel structures 310P(1)-310P(4), 310N(1)-310N(4) are constrained by the gates G(1)-G(7), G(9)-G(14) and the interlayer dielectric 318 as surrounding structures. In this manner, the circuit 300 can include the diffusion break 302 to isolate the cell circuits 301(1), 301(2) while potentially avoiding a reduction in carrier mobility in the P-type and/or N-type semiconductor channel structures 310P(1)-310P(4), 310N(1)-310N(4). The reduction or avoidance of strain relaxation in the P-type and/or N-type semiconductor channel structures 310P(1)-310P(4), 310N(1)-310N(4) may also avoid the need to include dummy gates, such as gates G(7) and G(9) adjacent to the diffusion break 302, in the cell circuits 301(1), 301(2) adjacent to the diffusion break 302, because an active semiconductor device may then be able to use the P-type and/or N-type semiconductor channel structures 310P(1)-310P(4), 310N(1)-310N(4) adjacent to the diffusion break 302 to form its semiconductor channel with the desired performance. Gates G(7), G(9) may both not be dummy gates, and also serve as active gates for a semiconductor device formed in the circuit 300 without reduced or relaxed strain in the P-type and/or N-type semiconductor channel structures 310P(1)-310P(4), 310N(1)-310N(4) used to form a semiconductor channel for the semiconductor device.

Also, in this example, the diffusion break 302 is a single diffusion break that has the width of approximately a width $W_G$ of a gate G(1)-G(14). This is because, as discussed below in one example, the diffusion break 302 can be formed by removing a gate, such as gate G(8) in this example, after the P-type and/or N-type semiconductor channel structures 310P(1)-310P(4), 310N(1)-310N(4) and the interlayer dielectric 318 are formed in the circuit 300 as surrounding structures. For example, as discussed in more detail below, the diffusion break 302 may be formed after the gates G(1)-G(14) and the interlayer dielectric 318 of the circuit 300 are formed as the surrounding structures, wherein a gate G is then removed and filled with the dielectric material 316 to form the diffusion break 302. Providing a single diffusion break 302 that avoids or reduces strain relaxation in the adjacent P-type and/or N-type semiconductor channel structures 310P(1)-310P(4), 310N(1)-310N(4) may allow more semiconductor devices to be formed in the circuit 300 to avoid area penalty, because adjacent gates G (e.g., gates G(7), G(9)) may be used to form active gates.

Figure 3C:
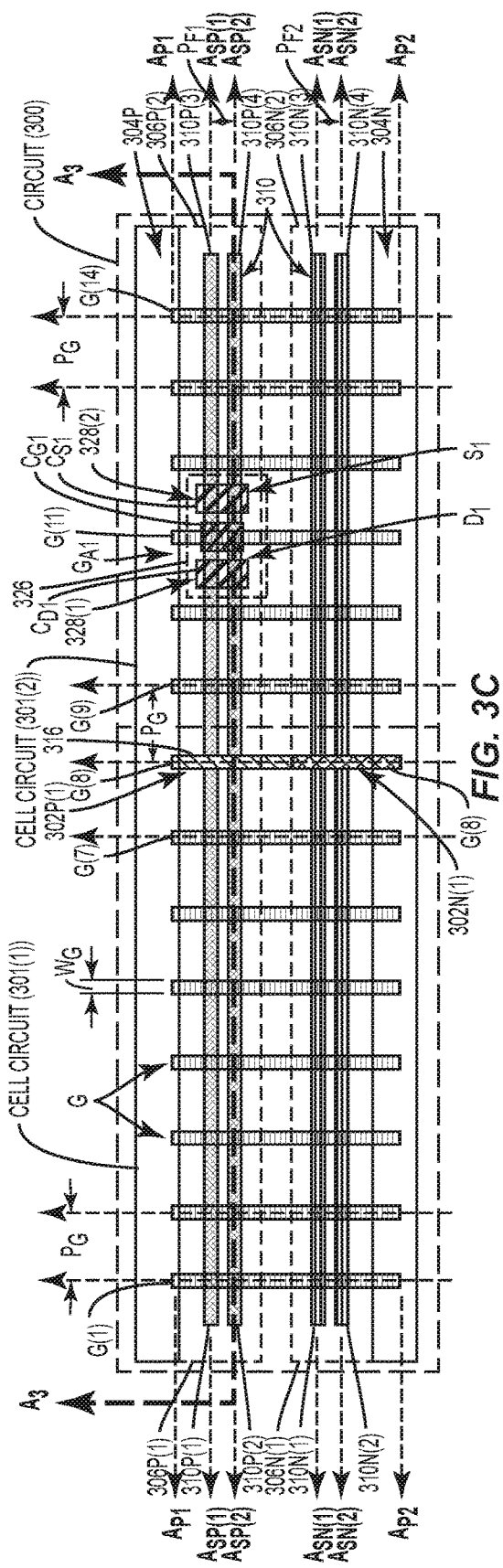
FIG. 3C is a top view of an exemplary circuit that includes adjacent cell circuits each having semiconductor channel structures (e.g., Fins) and active gates disposed around the semiconductor channel structures for forming semiconductor devices, wherein the P-type diffusion regions of the cell circuits are isolated by a single diffusion break.
Figure 3D:
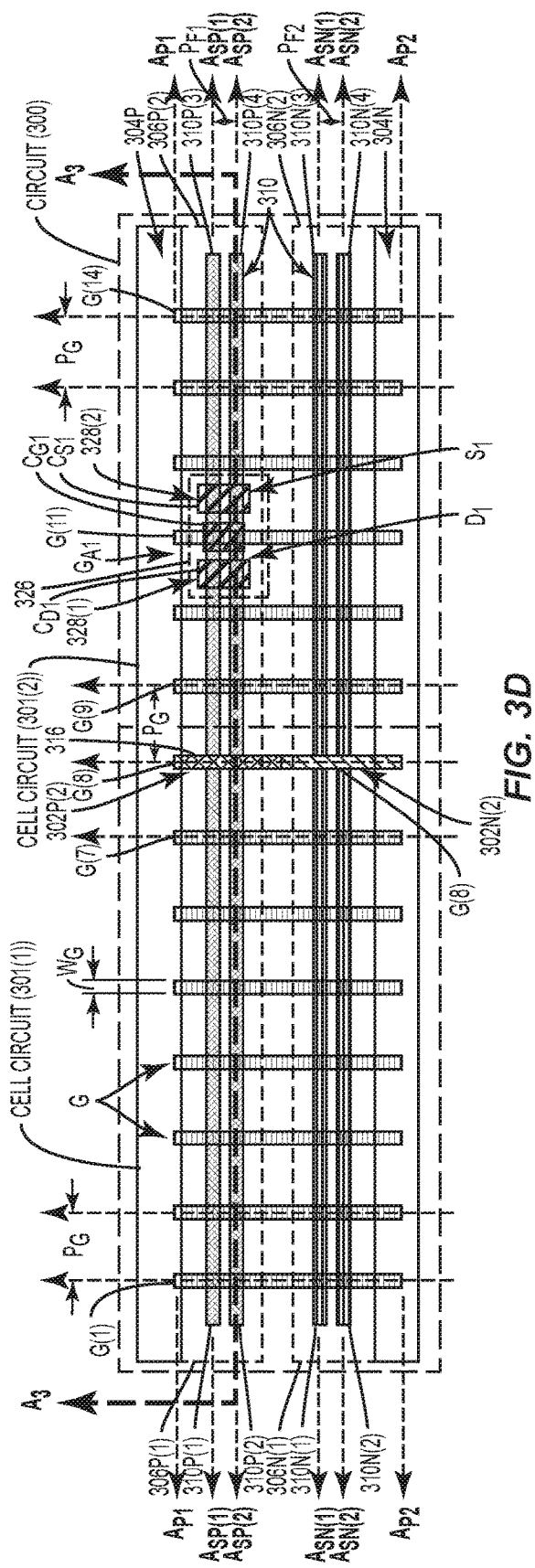
FIG. 3D is a top view of an exemplary circuit that includes adjacent cell circuits each having semiconductor channel structures (e.g., Fins) and active gates disposed around the semiconductor channel structures for forming semiconductor devices, wherein the N-type diffusion regions of the cell circuits are isolated by a single diffusion break.

Also note that in this example, the diffusion break 302 in FIG. 3A is shown as extending through each of the P-type semiconductor channel structures 310P(1)-310P(4) and the N-type semiconductor channel structures 310N(1)-310N(4). Note however, that the diffusion break 302 may also extend through a subset of the P-type semiconductor channel structures 310P(1)-310P(4) and/or the N-type semiconductor channel structures 310N(1)-310N(4). Note that if strain relaxation is not an issue or concern for N-type semiconductor devices formed in the circuit 300, creating a diffusion break 302P(1) like the diffusion break 302 with avoided or reduced strain relaxation may only be employed between the P-type diffusion regions 306P(1), 306P(2) as shown in FIG. 3C. Another diffusion break 302N(1) may be formed between the N-type diffusion regions 306N(1), 306N(2) that is formed, for example, by a semiconductor channel structure cut after semiconductor channel structure formation and without extending through the interlayer dielectric 318. The same is true in converse. That is, if strain relaxation is not an issue or concern for P-type semiconductor devices formed in the circuit 300, creating a diffusion break 302N(2) like the diffusion break 302 with avoided or reduced strain relaxation may only be employed between the N-type diffusion regions 306N(1), 306N(2). Another diffusion break 302P(2) may be formed between the P-type diffusion regions 306P(1), 306P(2) that is formed, for example, by a semiconductor channel structure cut after semiconductor channel structure formation and without extending through the interlayer dielectric 318.

Figure 4:
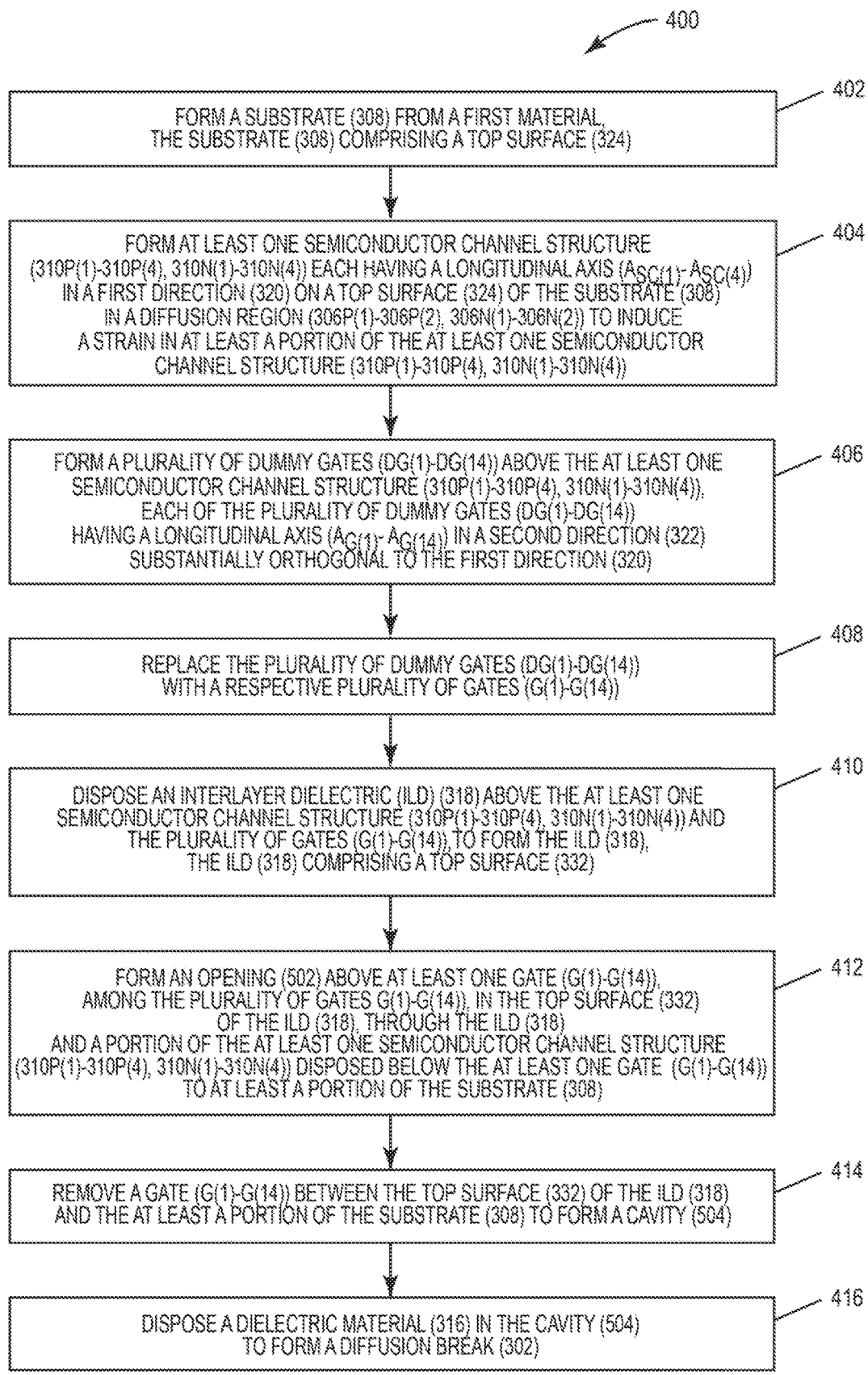
FIG. 4 is a flowchart illustrating an exemplary process of fabricating the circuit in FIGS. 3A and 3B, where the single diffusion break is formed by a removed gate filled with a dielectric material in a post middle of line (MOL) process after an interlayer dielectric (ILD) is disposed over the semiconductor channel structures and gates of the cell circuit, to reduce or prevent strain relaxation in a semiconductor channel structure(s) adjacent to the diffusion break.

FIG. 4 is a flowchart illustrating an exemplary process 400 of fabricating the circuit 300 in FIGS. 3A and 3B. In this exemplary process 400, as discussed in more detail below, the diffusion break 302 is formed by a removed gate filled with the dielectric material 316 in a post middle of line (MOL) process after the interlayer dielectric 318 is formed over the P-type and N-type semiconductor channel structures 310P(1)-310P(4), 310N(1)-310N(4) and gates G(1)-G(14) of the cell circuits 301(1), 301(2). Thus, the diffusion break 302 is formed after the surrounding structure of the P-type and N-type semiconductor channel structures 310P(1)-310P(4), 310N(1)-310N(4) and gates G(1)-G(14) are formed in the circuit 300 to reduce or prevent strain relaxation in a P-type and N-type semiconductor channel structure(s) 310P(1)-310P(4), 310N(1)-310N(4) adjacent to the diffusion break 302. Exemplary fabrication stages 500(1)-500(5) corresponding to the exemplary process 400 in FIG. 4 are illustrated in FIGS. 5A-1-5E-2. The process 400 in FIG. 4 will be discussed in conjunction with the fabrication stages 500(1)-500(5) in FIGS. 5A-1-5E-2.

Figures 1, 5B:
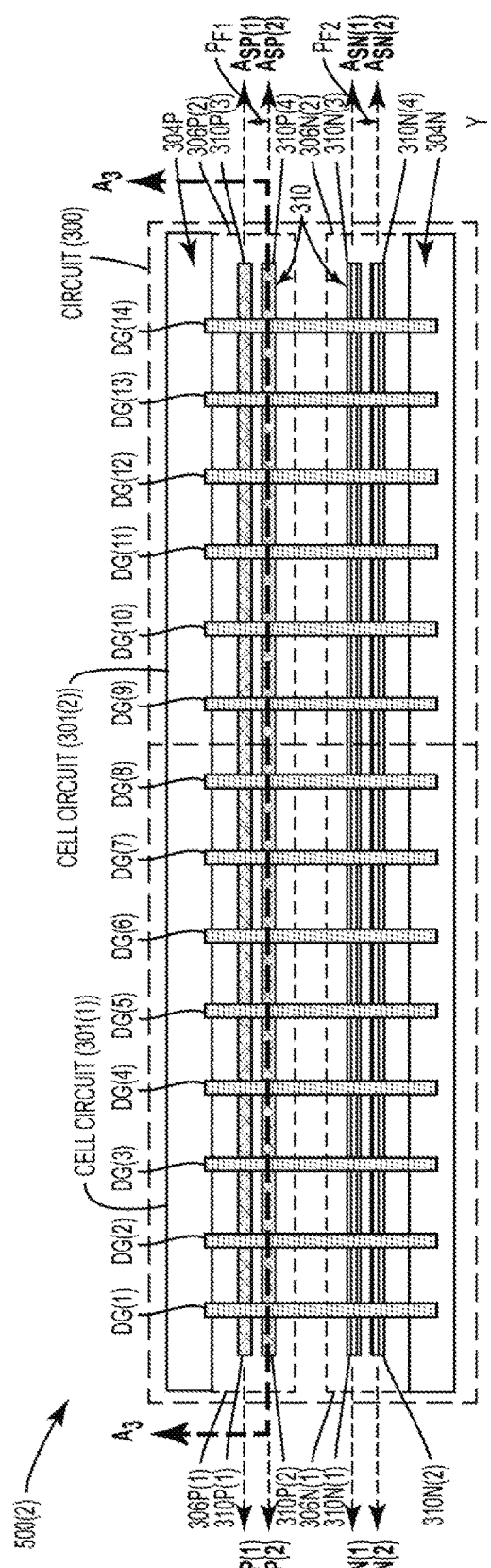
Figures 2, 5B:
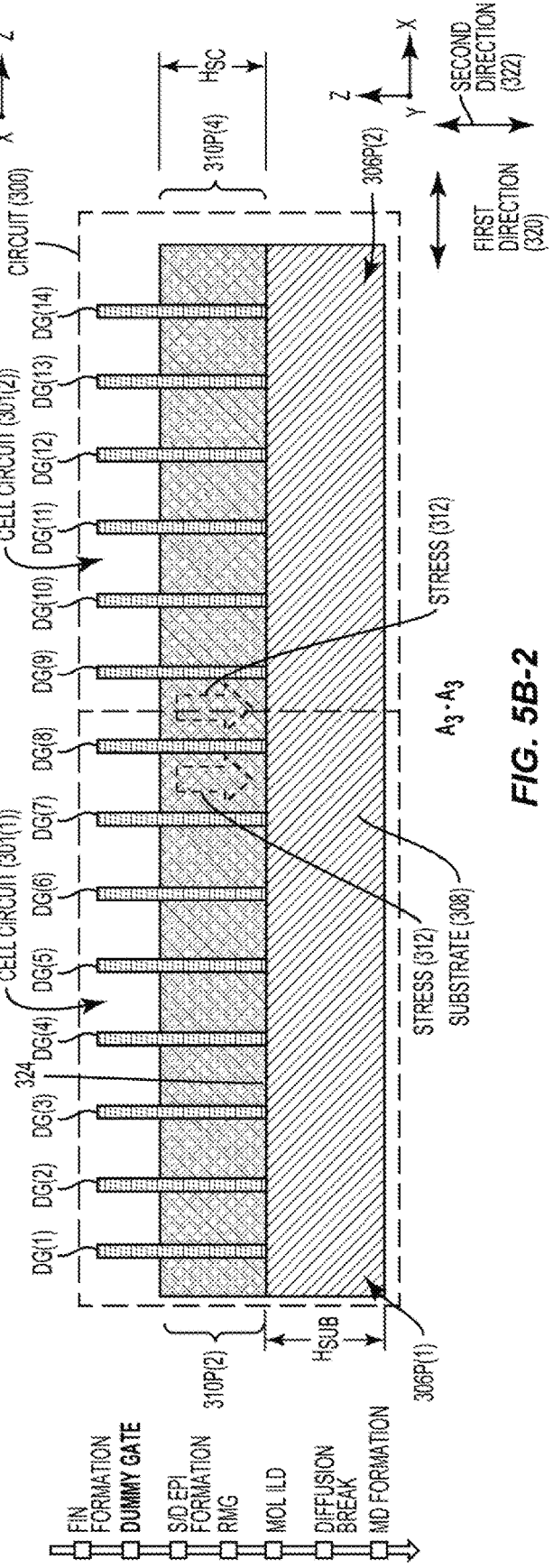

In this regard, with reference to FIG. 4, a first exemplary step in the process 400 of fabricating the circuit 300 in FIGS. 3A and 3B is to form the substrate 308 from a first material, wherein the substrate 308 comprises the top surface 324 (block 402). This is shown by example in the fabrication stage 500(1) in FIGS. 5A-1 and 5A-2. FIG. 5A-1 is a top view of the fabrication stage 500(1) of the circuit 300 in FIGS. 3A and 3B. FIG. 5B-1 is a cross-sectional side view of the fabrication stage 500(1) of the circuit 300 across cross-sectional break line $A_3$-$A_3$ in FIG. 5A-1. Common element structures between the fabrication stage 500(1) of the circuit 300 and the circuit 300 in FIGS. 3A and 3B are shown with common element numbers and thus will not be re-described. As also shown in FIGS. 5A-1 and 5A-2, the fabrication stage 500(1) of the circuit 300 includes the formation of the P-type and N-type semiconductor channel structures 310P(1)-310P(4), 310N(1)-310N(4) each having the longitudinal axis $A_{SC(1)}$-$A_{SC(4)}$ in the first direction 320 on the top surface 324 of the substrate 308 in a P-type and N-type diffusion region 306P(1)-306P(2), 306N(1)-306N(2) to induce the strain 313 in at least a portion of the P-type and N-type semiconductor channel structures 310P(1)-310P(4), 310N(1)-310N(4) (block 404 in FIG. 4). As a non-limiting example, the P-type and N-type semiconductor channel structures 310P(1)-310P(4), 310N(1)-310N(4) may have been formed by disposing a semiconductor material on the substrate 308 and applying a mask that has a pattern of the P-type and N-type semiconductor channel structures 310P(1)-310P(4), 310N(1)-310N(4) as part of a lithography process. A photoresist material layer could be disposed over the semiconductor material disposed on the substrate 308 and a mask could be applied and exposed to form openings where it is desired to etch away portions of the semiconductor material to leave the P-type and N-type semiconductor channel structures 310P(1)-310P(4), 310N(1)-310N(4). The portions of the semiconductor material below the openings can be etched and the photoresist layer can be removed.

With continuing reference to FIG. 4, a next exemplary step in the process 400 of fabricating the circuit 300 in FIGS. 3A and 3B is forming a plurality of dummy gates DG(1)-DG(14) above the P-type and N-type semiconductor channel structures 310P(1)-310P(4), 310N(1)-310N(4) (block 406 in FIG. 4). This is shown by example in the fabrication stage 500(2) in FIGS. 5B-1 and 5B-2. FIG. 5B-1 illustrates a top view of the exemplary second fabrication stage 500(2) of the circuit 300 in FIGS. 3A and 3B of dummy gate formation. FIG. 5B-2 is a cross-sectional side view of the fabrication stage 500(2) of the circuit 300 across cross-sectional break line $A_3$-$A_3$ in FIG. 5B-1. As shown in FIGS. 5B-1 and 5B-2, each of the dummy gates DG(1)-DG(14) has a longitudinal axis $A_{G(1)}$-$A_{G(14)}$ in the second direction 322 substantially orthogonal to the first direction 320. The dummy gates DG(1)-DG(14) may be a dielectric material. The dummy gates DG(1)-DG(14) are formed to allow spacers to be formed around the dummy gates DG(1)-DG(14) in a subsequent processing step to form openings therebetween to allow a metal material to be filled in the openings to form metal gates G(1)-G(14).

Figures 1, 5C:
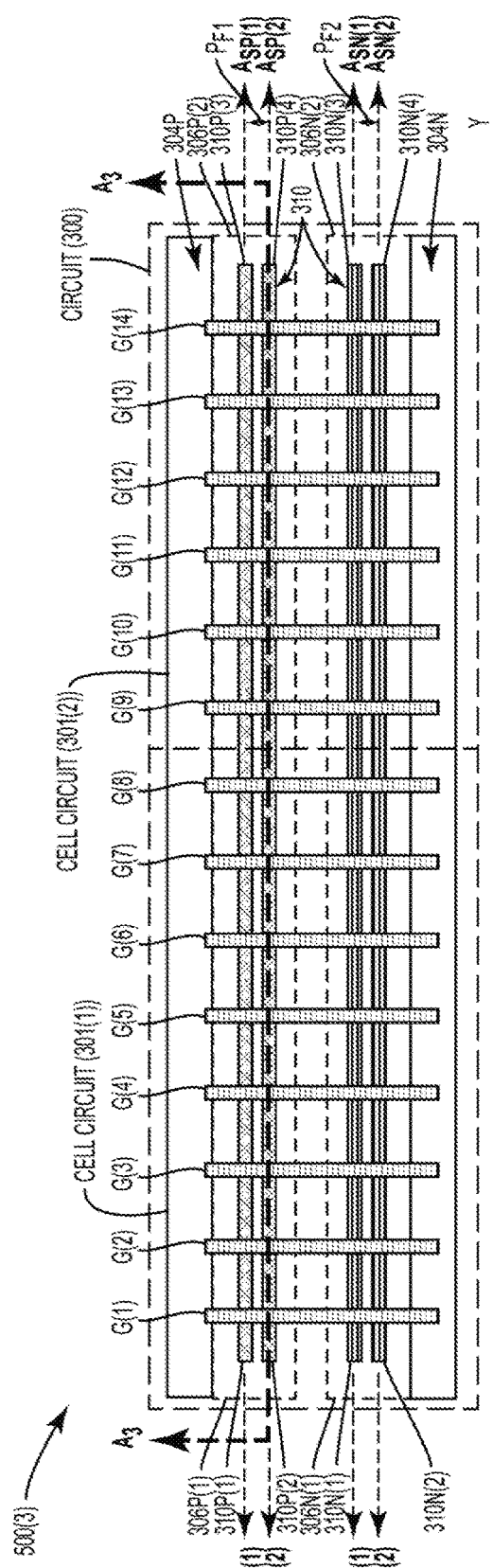
Figures 2, 5C:
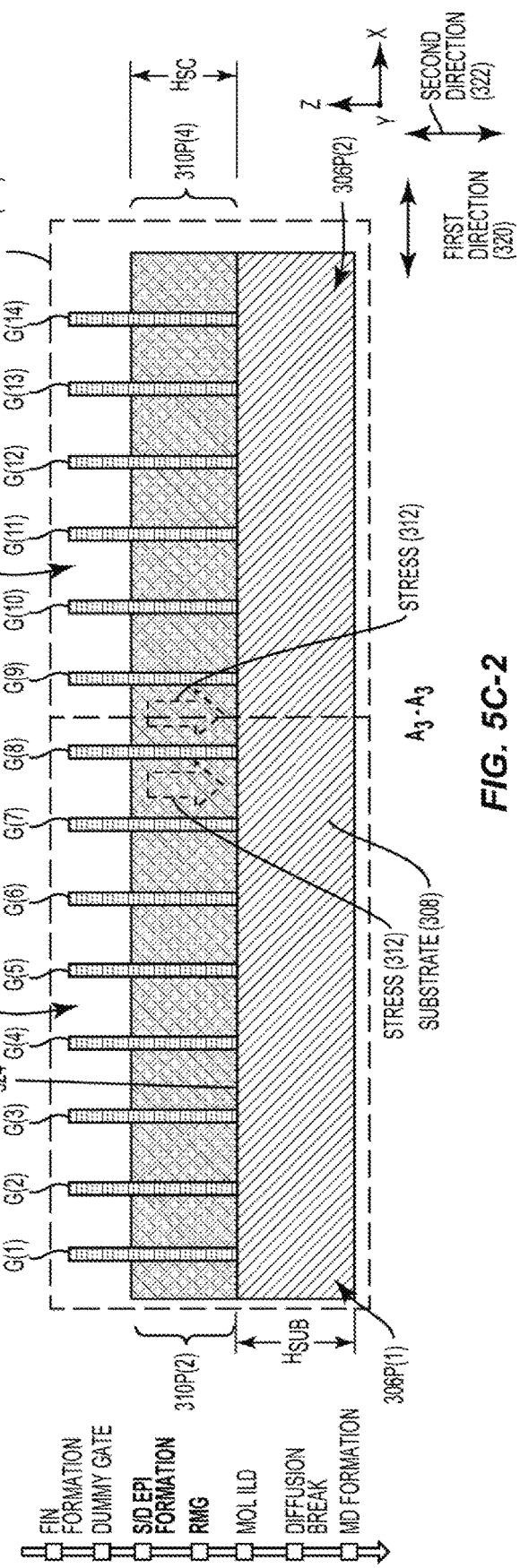

With continuing reference to FIG. 4, a next exemplary step in the process 400 of fabricating the circuit 300 in FIGS. 3A and 3B is forming sources S and drains D in portions of the P-type and N-type semiconductor channel structures 310P(1)-310P(4), 310N(1)-310N(4) where active semiconductor devices will be formed. This is shown by example in the fabrication stage 500(3) in FIGS. 5C-1 and 5C-2. FIG. 5C-1 illustrates a top view of the exemplary third fabrication stage 500(3) of the circuit 300 in FIGS. 3A and 3B of source/drain formation in the circuit 300 in FIGS. 3A and 3B. FIG. 5C-2 is a cross-sectional side view of the third fabrication stage 500(3) of the circuit 300 across cross-sectional break line $A_3$-$A_3$ in FIG. 5C-1. As shown in FIGS. 5C-1 and 5C-2, an exemplary source $S_1$ and drain $D_1$ are shown as being formed in the P-type semiconductor channel structures 310P(1) and/or 310P(2) adjacent to sides of the dummy gate DG(11). For example, the source St and drain $D_1$ could be epitaxially grown. For example, epitaxial growth of Phosphorous doped Silicon (SiP), Carbon Phosphorous doped Silicon (SiCP), or Phosphorous doped Germanium (GeP) may form regrown source/drain regions in the N-type diffusion regions 306N(1), 306N(2). Similarly, epitaxial growth of Boron doped Silicon Germanium (SiGeB), or Boron doped Germanium (GeB) may form regrown source/drain regions in the P-type diffusion regions 306P(1), 306P(2). As another example, the source $S_1$ and drain $D_1$ could be implanted through a diffusion process.

With continuing reference to FIG. 4, a next exemplary step in the process 400 of fabricating the circuit 300 in FIGS. 3A and 3B is replacing the dummy gates DG(1)-DG(14) with metal gates G(1)-G(14) (block 408 in FIG. 4). This is shown by example in the fabrication stage 500(4) in FIGS. 5D-1 and 5D-2. FIG. 5D-1 illustrates a top view of the exemplary fourth fabrication stage 500(4) of the circuit 300 in FIGS. 3A and 3B of formation of the gates G(1)-G(14) as metal gates. FIG. 5D-2 is a cross-sectional side view of the fabrication stage 500(4) of the circuit 300 across cross-sectional break line $A_3$-$A_3$ in FIG. 5D-1. As shown in FIGS. 5D-1 and 5D-2, each of the dummy gates DG(1)-DG(14) in FIGS. 5C-1 and 5C-2 have been replaced by metal gates G(1)-G(14), each having a longitudinal axis $A_{G(1)}$-$A_{G(4)}$ in the second direction 322 substantially orthogonal to the first direction 320. The metal gates G(1)-G(14) may be formed from a metal fill material formed to allow spacers to be formed around the dummy gates DG(1)-DG(14) in a subsequent processing step to form openings therebetween to allow a metal material to be filled in the openings to form the metal gates G(1)-G(14).

With continuing reference to FIG. 4, a next exemplary step in the process 400 of fabricating the circuit 300 in FIGS. 3A and 3B is disposing the dielectric material 330 above the P-type and N-type semiconductor channel structures 310P(1)-310P(4), 310N(l)-310N(4) and the plurality of gates G(1)-G(14) in this example to form the interlayer dielectric 318, the interlayer dielectric 318 comprising the top surface 332 (block 410 in FIG. 4). This is shown by example in the fabrication stage 500(5) in FIGS. 5E-1 and 5E-2. FIG. 5E-1 illustrates a top view of the exemplary fifth fabrication stage 500(5) of the circuit 300 in FIGS. 3A and 3B after the interlayer dielectric 318 has been formed above the P-type and N-type semiconductor channel structures 310P(1)-310P (4), 310N(1)-310N(4) and the plurality of gates G(1)-G(14) of the circuit 300. FIG. 5E-2 is a cross-sectional side view of the fabrication stage 500(5) of the circuit 300 across cross-sectional break line $A_3$-$A_3$ in FIG. 5E-1. An opening 502 is formed above gate G(8) in the top surface 332 of the interlayer dielectric 318 through a P-type and N-type semiconductor channel structure(s) 310P(1)-310P(4), 310N(1)-310N(4) and into at least a portion of the substrate 308 in this example (block 412 in FIG. 4). The gate G(8) is then removed below the opening 502 between the top surface 332 of the interlayer dielectric 318 and the at least a portion of the substrate 308 to form a cavity 504 (block 414 in FIG. 4). For example, a dry/wet etch process may be used to remove the gate G(8). The process 400 also comprises disposing the dielectric material 316 in the cavity 504 to form the diffusion break 302 (block 416 in FIG. 4). As discussed previously above, the cavity 504 may be approximately the gate width $W_G$ to avoid having to provide dummy gates DG(1)-DG(14) (i.e., unused Fins) adjacent to the diffusion break 302. Providing a larger-width cavity may require dummy Fins adjacent to the diffusion break 302, because a larger-width cavity would remove some of the semiconductor material of the P-type and N-type semiconductor channel structure(s) 310P(1)-310P(4), 310N(1)-310N(4) below the opening 502.

Other alternatives for providing a diffusion break in a circuit to form cell circuits with avoided or reduced semiconductor channel strain relaxation, can also be implemented and realized. For example, FIGS. 6A and 6B are respective top and cross-sectional side views of an alternative exemplary circuit 600 that also includes adjacent cell circuits 601(1), 601(2) each having semiconductor channel structures and gates disposed around the semiconductor channel structures. FIG. 6B is a cross-sectional side view of the circuit 600 along the $A_6$-$A_6$ line. Common structures and elements between the circuit 600 in FIGS. 6A and 6B and the circuit 300 in FIGS. 3A and 3B are shown with common element numbers or labeling, and thus the previous discussions of these elements are applicable as examples for the circuit 600 in FIGS. 6A and 6B. However, in the circuit 600 in FIGS. 6A and 6B, the cell circuits 601(1), 601(2) are isolated by a double diffusion break 602. However, in the example of the circuit 600 as shown in FIGS. 6A and 6B, the double diffusion break 602 is formed from diffusion break structures 604(1), 604(2) of the dielectric material 316 disposed in two (2) removed adjacent gates G(8), G(9). Like the diffusion break 302 in the circuit 300 in FIGS. 3A and 3B, the double diffusion break 602 extends through a surrounding interlayer dielectric 318, the P-type and N-type semiconductor channel structures 310P(1)-310P(4), 310N (1)-310N(4), and at least partially through the substrate 308 to reduce or avoid strain relaxation in an adjacent P-type and N-type semiconductor channel structure(s) 310P(1)-310P (4), 310N(1)-310N(4).

With continuing reference to FIGS. 6A and 6B, the double diffusion break 602 included in the circuit 600 to delineate and isolate the cell circuits 601(1), 601(2) is disposed between the P-type and N-type diffusion regions 306P(1), 306N(1) and the P-type and N-type diffusion regions 306P (2), 306N(2). The first and second diffusion break structures 604(1), 604(2) that comprise the double diffusion break 602 are both disposed a gate pitch $P_G$ distance from gates G(7), G(10) disposed on each side of the double diffusion break 602. The first and second diffusion break structures 604(1), 604(2) each comprise the dielectric material 316 that extends along longitudinal axes $A_{G(8)}$, $A_{G(9)}$ where gates G(8), G(9) were originally formed in the circuit 600. The first and second diffusion break structures 604(1), 604(2) extend along the longitudinal axes $A_{G(8)}$, $A_{G(9)}$ in the second direction 322 from the top surface 332 of the interlayer dielectric 318 and through the interlayer dielectric 318, the P-type and/or N-type semiconductor channel structures 310P(1)-310P(4), 310N(1)-310N(4), and through a portion of the substrate 308. In this example, the first and second diffusion break structures 604(1), 604(2) extend a depth $D_1$ into the substrate 308 in the second direction 322. In this manner, the relaxation of strain 313 induced in the areas of P-type and/or N-type semiconductor channel structures 310P(1)-310P(4), 310N(1)-310N(4) adjacent to the first and second diffusion break structures 604(1), 604(2) extended as a result of the stress 312 applied in the P-type and/or N-type semiconductor channel structures 310P(1)-310P(4), 310N (1)-310N(4) can be reduced or avoided, because the P-type and/or N-type semiconductor channel structures 310P(1)-310P(4), 310N(1)-310N(4) are constrained by the gates G(1)-G(7), G(10)-G(14) and the interlayer dielectric 318 as surrounding structures. In this manner, the circuit 600 can include the double diffusion break 602 to isolate the cell circuits 601(1), 601(2) while potentially avoiding a reduction in carrier mobility in the P-type and/or N-type semiconductor channel structures 310P(1)-310P(4), 310N(1)-310N(4). Gates G(7), G(10) may both not be dummy gates, and may also serve as active gates for a semiconductor device formed in the circuit 600 without reduced or relaxed strain in the P-type and/or N-type semiconductor channel structures 310P(1)-310P(4), 310N(1)-310N(4) used to form a semiconductor channel for the semiconductor device.

Also, in this example, the first and second diffusion break structures 604(1), 604(1) each have the width of approximately the width $W_G$ of a gate G(1)-G(14). This is because, in one example, the first and second diffusion break structures 604(1), 604(2) can be formed by removing a gate, such as gates G(8), G(9) in this example, after the P-type and/or N-type semiconductor channel structures 310P(1)-310P(4), 310N(1)-310N(4) and the interlayer dielectric 318 are formed in the circuit 600 as surrounding structures like the process 400 discussed above with regard to FIG. 4 and the fabrication stages 500(1)-500(5) for the circuit 300 in FIGS. 5A-1-5E-2. For example, as discussed in more detail below, the first and second diffusion break structures 604(1), 604(2) may be formed after the gates G(1)-G(14) and the interlayer dielectric 318 of the circuit 600 are formed as the surrounding structures, wherein the gates G(8), G(9) are removed and filled with a dielectric material 616(1), 616(2) to form the double diffusion break 602. The other discussions and alternatives regarding the circuit 300 and its diffusion break 302 in the circuit 300 in FIGS. 3A and 3B can also be applicable for the circuit 600 in FIGS. 6A and 6B.

FIGS. 7A and 7B are respective top and cross-sectional side views of another alternative exemplary circuit 700 that also includes adjacent cell circuits 701(1), 701(2) in the circuit 300 in FIGS. 3A and 3B each having semiconductor channel structures and gates disposed around the semiconductor channel structures. FIG. 7B is a cross-sectional side view of the circuit 700 along the $A_7$-$A_7$ line. Common structures and elements between the circuit 700 in FIGS. 7A and 7B and the circuits 300, 600 in FIGS. 3A and 3B and 6A and 6B are shown with common element numbers or labeling, and thus the previous discussions of these elements are applicable as examples for the circuit 700 in FIGS. 7A and 7B. However, in the circuit 700 in FIGS. 7A and 7B, the cell circuits 701(1), 701(2) are isolated by an alternative double diffusion break 702. However, in the example of the circuit 700 as shown in FIGS. 7A and 7B, the double diffusion break 702 is disposed of approximately a gate pitch width of the dielectric material 316 disposed in and between removed adjacent gates G(8), G(9). Like the diffusion break 302 in the circuit 300 in FIGS. 3A and 3B, the double diffusion break 702 extends through a surrounding interlayer dielectric 318, the P-type and N-type semiconductor channel structures 310P(1)-310P(4), 310N(1)-310N(4), and at least partially through the substrate 308 to reduce or avoid strain relaxation in an adjacent P-type and N-type semiconductor channel structure(s) 310P(1)-310P(4), 310N(1)-310N(4).

With continuing reference to FIGS. 7A and 7B, the double diffusion break 702 included in the circuit 700 to delineate and isolate the cell circuits 701(1), 701(2) is disposed between the P-type and N-type diffusion regions 306P(1), 306N(1) and the P-type and N-type diffusion regions 306P(2), 306N(2). The double diffusion break 702 is disposed a gate pitch $P_G$ distance from gates G(7), G(10) disposed on each side of the double diffusion break 702. The double diffusion break 702 comprises the dielectric material 316 where gates G(8), G(9) were originally formed in the circuit 700 and where semiconductor material of adjacent P-type and N-type semiconductor channel structure(s) 310P(1)-310P(4), 310N(I)-310N(4) between the gates G(8), G(9) was originally formed. The double diffusion break 702 extends along a longitudinal axis $A_{DB}$ in the second direction 322 from the top surface 332 of the interlayer dielectric 318 and through the interlayer dielectric 318, the P-type and/or N-type semiconductor channel structures 310P(1)-310P(4), 310N(1)-310N(4), and through a portion of the substrate 308. In this example, the double diffusion break 702 extends the depth $D_1$ into the substrate 308 in the second direction 322. In this manner, the relaxation of strain 313 induced in the areas of the P-type and/or N-type semiconductor channel structures 310P(1)-310P(4), 310N(1)-310N(4) adjacent to the double diffusion break 702 extended as a result of the stress 312 applied in the P-type and/or N-type semiconductor channel structures 310P(1)-310P(4), 310N(1)-310N(4) can be reduced or avoided, because the P-type and/or N-type semiconductor channel structures 310P(1)-310P(4), 310N(1)-310N(4) are constrained by the gates G(1)-G(7), G(10)-G(14) and the interlayer dielectric 318 as surrounding structures. In this manner, the circuit 700 can include the double diffusion break 702 to isolate the cell circuits 701(1), 701(2) while potentially avoiding a reduction in carrier mobility in the P-type and/or N-type semiconductor channel structures 310P(1)-310P(4), 310N(1)-310N(4). Gates G(7), G(10) may both not be dummy gates, and may also serve as active gates for semiconductor device formed in the circuit 700 without reduced or relaxed strain in the P-type and/or N-type semiconductor channel structures 310P(1)-310P(4), 310N(1)-310N(4) used to form a semiconductor channel for the semiconductor device.

Also, in this example, the double diffusion break 702 can be formed by removing adjacent gates G(8), G(9), and the semiconductor material of adjacent P-type and N-type semiconductor channel structure(s) 310P(1)-310P(4), 310N(1)-310N(4) between the gates G(8), G(9) that was originally formed, after the P-type and/or N-type semiconductor channel structures 310P(1)-310P(4), 310N(1)-310N(4) and interlayer dielectric 318 are formed in the circuit 700 as surrounding structures, like the process 400 discussed above with regard to FIG. 4 and the fabrication stages 500(1)-500(5) for the circuit 300 in FIGS. 5A-1-5E-2. For example, as discussed in more detail below, the double diffusion break 702 may be formed after the gates G(1)-G(14) and the interlayer dielectric 318 of the circuit 700 are formed as the surrounding structures, wherein the gates G(8), G(9) are removed and filled with the dielectric material 316 to form the double diffusion break 702. The other discussions and alternatives regarding the circuit 300 and its diffusion break 302 in the circuit 300 in FIGS. 3A and 3B can also be applicable for the circuit 700 in FIGS. 7A and 7B.

In another aspect, a circuit is provided. The circuit comprises a substrate comprising a top surface. Examples of the substrate include the substrate 308 in FIGS. 3A-3B, 5A-1-5E-2, 6A-6B, and 7A-7B. The circuit also comprises at least one means for inducing a strain in at least a portion of at least one first semiconductor channel structure in a first diffusion region. Examples of the at least one means for inducing a strain in at least a portion of at least one first semiconductor channel structure in a first diffusion region include the P-type semiconductor channel structure(s) 310P(1)-310P(4) in FIGS. 3A-3B, 5A-1-5E-2, 6A-6B, and 7A-7B. The circuit also comprises at least one means for inducing a strain in at least a portion of at least one second semiconductor channel structure in a second diffusion region. Examples of the at least one means for inducing a strain in at least a portion of at least one second semiconductor channel structure in a second diffusion region include the P-type semiconductor channel structure(s) 310P(1)-310P(4) in FIGS. 3A-3B, 5A-1-5E-2, 6A-6B, and 7A-7B. The circuit also comprises a means for insulating the at least one means for inducing the strain in the at least a portion of the at least one first semiconductor channel structure and the at least one means for inducing the strain in the at least a portion of the at least one second semiconductor channel structure. Examples of the means for insulating the at least one means for inducing the strain in the at least a portion of the at least one first semiconductor channel structure and the at least one means for inducing the strain in the at least a portion of the at least one second semiconductor channel structure include the interlayer dielectric 318 in FIGS. 3A-3B, 5A-1-5E-2, 6A-6B, and 7A-7B. The circuit also comprises a means for isolating the first diffusion region from the second diffusion region in a diffusion break. Examples of the means for isolating the first diffusion region from the second diffusion region in a diffusion break include the diffusion break 302 in FIGS. 3A-3B and 5A-1-5E-2, the double diffusion break 602 in FIGS. 6A-6B, and the double diffusion break 702 in FIGS. 7A-7B.

Circuits having adjacent cell circuits isolated by a diffusion break formed from at least one removed gate through an interlayer dielectric with reduced adjacent semiconductor channel strain relaxation, including but not limited to the circuits 300, 600, 700 in FIGS. 3A and 3B, 6A and 6B, and 7A and 7B, and according to any aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 8:
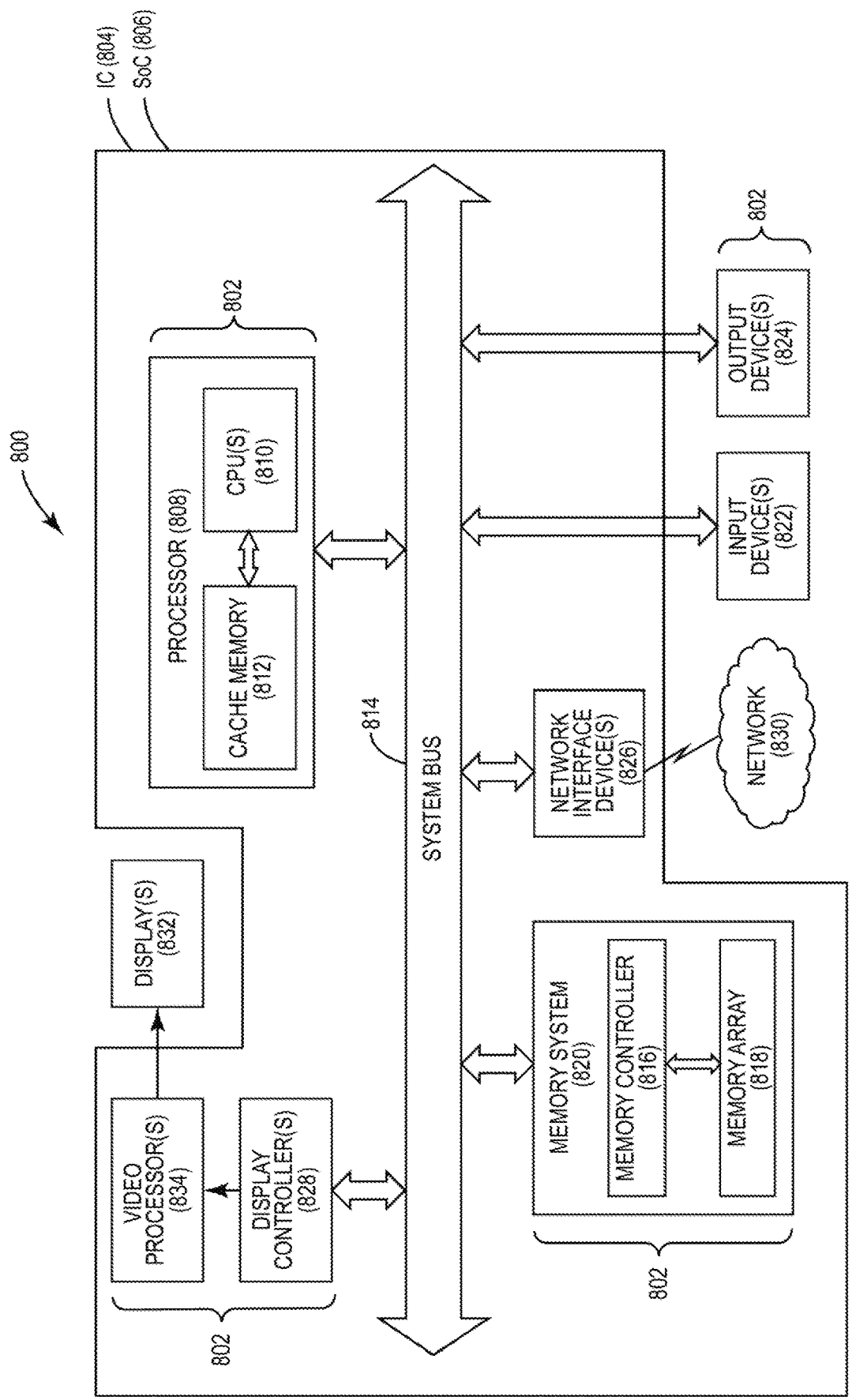
FIG. 8 is a block diagram of an exemplary processor-based system that can include a circuit with adjacent cell circuits isolated by a diffusion break formed from at least one removed gate through an interlayer dielectric with reduced adjacent semiconductor channel strain relaxation, including but not limited to the circuits in FIGS. 3A and 3B, 6A and 6B, and 7A and 7B.

In this regard, FIG. 8 illustrates an example of a processor-based system 800 that can include circuits 802 with adjacent cell circuits isolated by a diffusion break formed from at least one removed gate through an interlayer dielectric with reduced adjacent semiconductor channel strain relaxation, including but not limited to the circuits 300, 600, 700 in FIGS. 3A and 3B, 6A and 6B, and 7A and 7B, and according to any aspects disclosed herein. In this example, the processor-based system 800 may be formed as an IC 804 in a system-on-a-chip (SoC) 806. The processor-based system 800 includes a processor 808 that includes one or more central processor units (CPUs) 810, which may also be referred to as CPU or processor cores. The processor 808 may have cache memory 812 coupled to the processor(s) 808 for rapid access to temporarily stored data. As an example, the cache memory 812 could include circuits 802 with adjacent cell circuits isolated by a diffusion break formed from at least one removed gate through an interlayer dielectric with reduced adjacent semiconductor channel strain relaxation, including but not limited to the circuits 300, 600, 700 in FIGS. 3A and 3B, 6A and 6B, and 7A and 7B, and according to any aspects disclosed herein. The processor 808 is coupled to a system bus 814 and can intercouple master and slave devices included in the processor-based system 800. As is well known, the processor 808 communicates with these other devices by exchanging address, control, and data information over the system bus 814. For example, the processor 808 can communicate bus transaction requests to a memory controller 816 as an example of a slave device. Although not illustrated in FIG. 8, multiple system buses 814 could be provided, wherein each system bus 814 constitutes a different fabric.

Other master and slave devices can be connected to the system bus 814. As illustrated in FIG. 8, these devices can include a memory system 820 that includes the memory controller 816 and a memory array(s) 818, one or more input devices 822, one or more output devices 824, one or more network interface devices 826, and one or more display controllers 828, as examples. Each of the memory system 820, the one or more input devices 822, the one or more output devices 824, the one or more network interface devices 826, and the one or more display controllers 828 can include circuits 802 with adjacent cell circuits isolated by a diffusion break formed from at least one removed gate through an interlayer dielectric with reduced adjacent semiconductor channel strain relaxation, including but not limited to the circuits 300, 600, 700 in FIGS. 3A and 3B, 6A and 6B, and 7A and 7B, and according to any aspects disclosed herein. The input device(s) 822 can include any type of input device, including, but not limited to, input keys, switches, voice processors, etc. The output device(s) 824 can include any type of output device, including, but not limited to, audio, video, other visual indicators, etc. The network interface device(s) 826 can be any device configured to allow exchange of data to and from a network 830. The network 830 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 826 can be configured to support any type of communications protocol desired.

The processor 808 may also be configured to access the display controller(s) 828 over the system bus 814 to control information sent to one or more displays 832. The display controller(s) 828 sends information to the display(s) 832 to be displayed via one or more video processors 834, which process the information to be displayed into a format suitable for the display(s) 832. The display(s) 832 can include any type of display, including, but not limited to, a cathode ray tube (CRT), a liquid crystal display (LCD), a plasma display, a light emitting diode (LED) display, etc. The display controller(s) 828, display(s) 832, and/or the video processor(s) 834 can include circuits 802 with adjacent cell circuits isolated by a diffusion break formed from at least one removed gate through an interlayer dielectric with reduced adjacent semiconductor channel strain relaxation, including but not limited to the circuits 300, 600, 700 in FIGS. 3A and 3B, 6A and 6B, and 7A and 7B, and according to any aspects disclosed herein.

Figure 9:
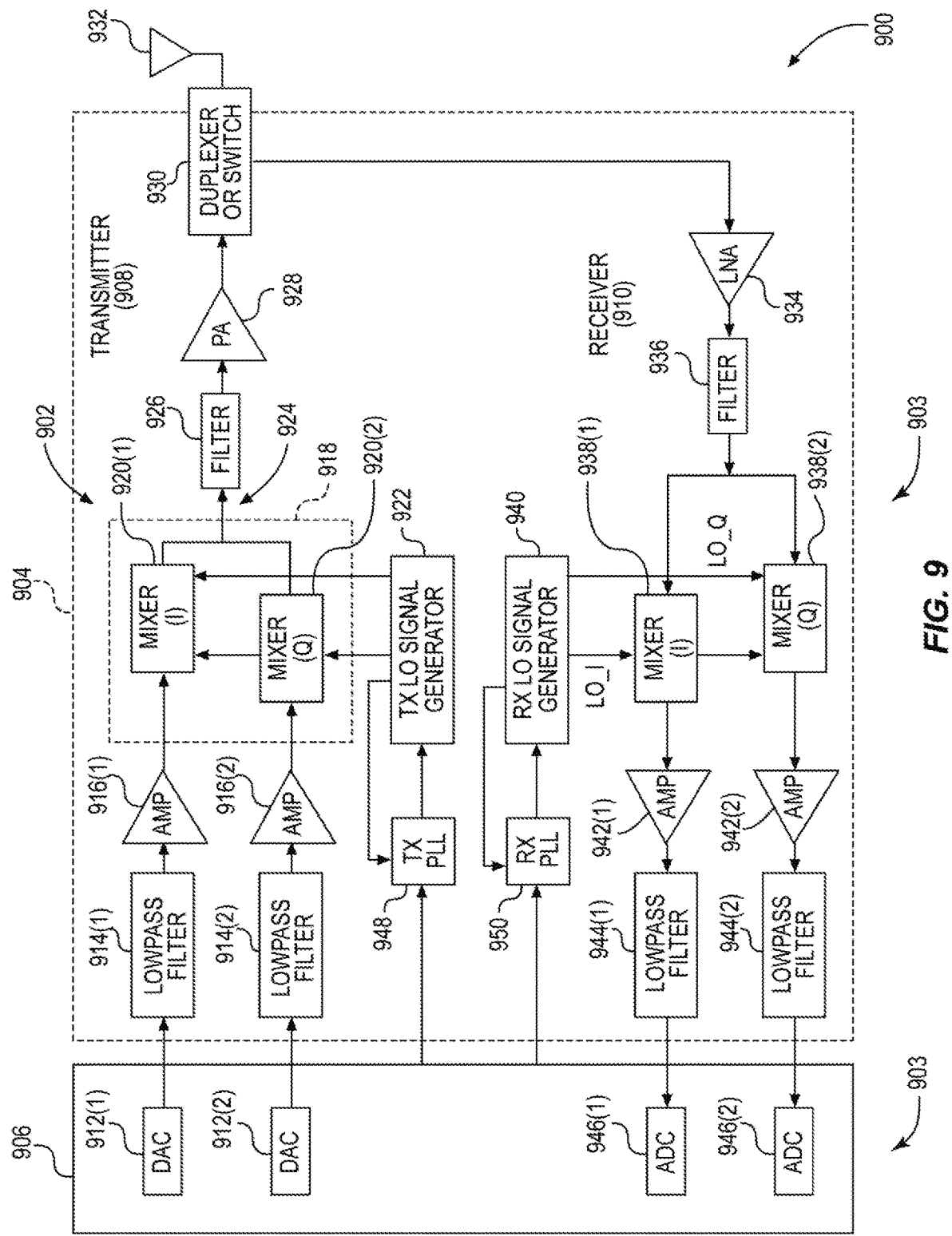
FIG. 9 is a block diagram of an exemplary wireless communications device that includes radio frequency (RF) components formed from an integrated circuit (IC), wherein any of the components therein can include a circuit with adjacent cell circuits isolated by a diffusion break formed from at least one removed gate through an interlayer dielectric with reduced adjacent semiconductor channel strain relaxation, including but not limited to the circuits in FIGS. 3A and 3B, 6A and 6B, and 7A and 7B.

FIG. 9 illustrates an exemplary wireless communications device 900 that includes radio frequency (RF) components formed from an IC 902, wherein any of the components therein can include circuits 903 with adjacent cell circuits isolated by a diffusion break formed from at least one removed gate through an interlayer dielectric with reduced adjacent semiconductor channel strain relaxation, including but not limited to the circuits 300, 600, 700 in FIGS. 3A and 3B, 6A and 6B, and 7A and 7B, and according to any aspects disclosed herein. The wireless communications device 900 may include or be provided in any of the above referenced devices, as examples. As shown in FIG. 9, the wireless communications device 900 includes a transceiver 904 and a data processor 906. The data processor 906 may include a memory to store data and program codes. The transceiver 904 includes a transmitter 908 and a receiver 910 that support bi-directional communications. In general, the wireless communications device 900 may include any number of transmitters 908 and/or receivers 910 for any number of communication systems and frequency bands. All or a portion of the transceiver 904 may be implemented on one or more analog ICs, RF ICs (RFICs), mixed-signal ICs, etc.

The transmitter 908 or the receiver 910 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 910. In the direct-conversion architecture, a signal is frequency-converted between RF and baseband in one stage. The super-heterodyne and direct-conversion architectures may use different circuit blocks and/or have different requirements. In the wireless communications device 900 in FIG. 9, the transmitter 908 and the receiver 910 are implemented with the direct-conversion architecture.

In the transmit path, the data processor 906 processes data to be transmitted and provides I and Q analog output signals to the transmitter 908. In the exemplary wireless communications device 900, the data processor 906 includes digital-to-analog converters (DACs) 912(1), 912(2) for converting digital signals generated by the data processor 906 into the I and Q analog output signals, e.g., I and Q output currents, for further processing.

Within the transmitter 908, lowpass filters 914(1), 914(2) filter the I and Q analog output signals, respectively, to remove undesired signals caused by the prior digital-to-analog conversion. Amplifiers (AMP) 916(1), 916(2) amplify the signals from the lowpass filters 914(1), 914(2), respectively, and provide I and Q baseband signals. An upconverter 918 upconverts the I and Q baseband signals with I and Q transmit (TX) local oscillator (LO) signals through mixers 920(1), 920(2) from a TX LO signal generator 922 to provide an upconverted signal 924. A filter 926 filters the upconverted signal 924 to remove undesired signals caused by the frequency upconversion as well as noise in a receive frequency band. A power amplifier (PA) 928 amplifies the upconverted signal 924 from the filter 926 to obtain the desired output power level and provides a transmit RF signal. The transmit RF signal is routed through a duplexer or switch 930 and transmitted via an antenna 932.

In the receive path, the antenna 932 receives signals transmitted by base stations and provides a received RF signal, which is routed through the duplexer or switch 930 and provided to a low noise amplifier (LNA) 934. The duplexer or switch 930 is designed to operate with a specific receive (RX)-to-TX duplexer frequency separation, such that RX signals are isolated from TX signals. The received RF signal is amplified by the LNA 934 and filtered by a filter 936 to obtain a desired RF input signal. Downconversion mixers 938(1), 938(2) mix the output of the filter 936 with I and Q RX LO signals (i.e., LO_I and LO_Q) from an RX LO signal generator 940 to generate I and Q baseband signals. The I and Q baseband signals are amplified by amplifiers (AMP) 942(1), 942(2) and further filtered by lowpass filters 944(1), 944(2) to obtain I and Q analog input signals, which are provided to the data processor 906. In this example, the data processor 906 includes ADCs 946(1), 946(2) for converting the analog input signals into digital signals to be further processed by the data processor 906.

In the wireless communications device 900 of FIG. 9, the TX LO signal generator 922 generates the I and Q TX LO signals used for frequency upconversion, while the RX LO signal generator 940 generates the I and Q RX LO signals used for frequency downconversion. Each LO signal is a periodic signal with a particular fundamental frequency. A TX phase-locked loop (PLL) circuit 948 receives timing information from the data processor 906 and generates a control signal used to adjust the frequency and/or phase of the TX LO signals from the TX LO signal generator 922. Similarly, an RX PLL circuit 950 receives timing information from the data processor 906 and generates a control signal used to adjust the frequency and/or phase of the RX LO signals from the RX LO signal generator 940.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:
1. A circuit, comprising:
   a substrate comprising a top surface;
   a first cell circuit, comprising:
      a first diffusion region disposed above the substrate, the first diffusion region comprising:

at least one first semiconductor channel structure each having a longitudinal axis in a first direction and disposed on the top surface of the substrate; and at least one first gate each having a longitudinal axis in a second direction substantially orthogonal to the first direction and disposed above the at least one first semiconductor channel structure;

a second cell circuit, comprising:
a second diffusion region disposed above the substrate, the second diffusion region comprising:
at least one second semiconductor channel structure having a longitudinal axis in the first direction and disposed on the top surface of the substrate; and
at least one second gate each having a longitudinal axis in the second direction and disposed above the at least one second semiconductor channel structure;

an interlayer dielectric disposed above the at least one first semiconductor channel structure and the at least one second semiconductor channel structure, the interlayer dielectric comprising a top surface; and a diffusion break disposed between the first diffusion region and the second diffusion region, the diffusion break comprising a dielectric material extending along a longitudinal axis in the second direction at the top surface of the interlayer dielectric, through the interlayer dielectric, and through at least a portion of the substrate.

2. The circuit of claim 1, wherein:
a first gate among the at least one first gate is disposed adjacent to a first side of the diffusion break by a first gate pitch; and
a second gate among the at least one second gate is disposed adjacent to a second side of the diffusion break opposite the first side of the diffusion break by a second gate pitch.

3. The circuit of claim 2, wherein:
the first gate comprises a first active gate; and
the second gate comprises a second active gate.

4. The circuit of claim 3, wherein:
the first gate does not comprise a dummy gate; and
the second gate does not comprise a dummy gate.

5. The circuit of claim 1, wherein:
the at least one first gate has a gate width in the second direction;
the at least one second gate has a second gate width in the second direction, the second gate width equal to the first gate width;
the diffusion break comprising a diffusion break structure comprising the dielectric material extending along the longitudinal axis in the second direction at the top surface of the interlayer dielectric, through the interlayer dielectric, and through the at least a portion of the substrate; and
the diffusion break structure having the gate width along its longitudinal axis in the second direction.

6. The circuit of claim 1, wherein:
the at least one first gate has a gate width in the second direction; and
the at least one second gate has a second gate width in the second direction, the second gate width equal to the gate width;
the diffusion break, comprising:
a first diffusion break structure comprising the dielectric material extending along the longitudinal axis in the second direction at the top surface of the interlayer dielectric, through the interlayer dielectric, and through the at least a portion of the substrate;
the first diffusion break structure having the gate width along its longitudinal axis in the second direction;
a second diffusion break structure adjacent to the first diffusion break structure and separated by the first diffusion break structure in the first direction by the gate width, the second diffusion break structure comprising the dielectric material extending along the longitudinal axis in the second direction at the top surface of the interlayer dielectric, through the interlayer dielectric, and through the at least a portion of the substrate; and
the second diffusion break structure having the gate width along its longitudinal axis in the second direction.

7. The circuit of claim 1, wherein;
the at least one first gate has a gate width in the second direction;
the at least one second gate has a second gate width in the second direction, the second gate width equal to the gate width; and
the diffusion break comprising the dielectric material extending along the longitudinal axis in the second direction at the top surface of the interlayer dielectric having a gate pitch width along its longitudinal axis in the second direction.

8. The circuit of claim 1, wherein:
the first diffusion region comprises:
a first P-type diffusion region disposed above the substrate and having a longitudinal axis in the first direction, the first P-type diffusion region comprising:
at least one first P-type semiconductor channel structure each having a longitudinal axis in the first direction and disposed on the top surface of the substrate;
a first N-type diffusion region disposed above the substrate and having a longitudinal axis in the first direction, the first N-type diffusion region comprising:
at least one first N-type semiconductor channel structure each having a longitudinal axis in the first direction and disposed on the top surface of the substrate; and
the at least one first gate each having the longitudinal axis extending in the second direction in the first P-type diffusion region and the first N-type diffusion region; and
the second diffusion region comprises:
a second P-type diffusion region disposed above the substrate and having a longitudinal axis in the first direction, the second P-type diffusion region comprising:
at least one second P-type semiconductor channel structure each having a longitudinal axis in the first direction and disposed on the top surface of the substrate;
a second N-type diffusion region disposed above the substrate and having a longitudinal axis in the first direction, the second N-type diffusion region comprising:
at least one second N-type semiconductor channel structure each having a longitudinal axis in the first direction and disposed on the top surface of the substrate; and the at least one second gate each having the longitudinal axis extending in the second direction in the second P-type diffusion region and the second N-type diffusion region.

9. The circuit of claim 8, wherein:
the substrate induces a compressive strain in at least a portion of the at least one first P-type semiconductor channel structure; and
the substrate does not induce a tensile strain in at least a portion of the at least one first N-type semiconductor channel structure.

10. The circuit of claim 8, wherein:
the substrate does not induce a compressive strain in at least a portion of the at least one first P-type semiconductor channel structure; and
the substrate induces a tensile strain in at least a portion of the at least one first N-type semiconductor channel structure.

11. The circuit of claim 8, wherein:
the substrate induces a compressive strain in at least a portion of the at least one first P-type semiconductor channel structure; and
the substrate induces a tensile strain in at least a portion of the at least one first N-type semiconductor channel structure.

12. The circuit of claim 8, wherein:
the diffusion break is disposed between the first P-type diffusion region and the second P-type diffusion region; and
the diffusion break is not disposed between the first N-type diffusion region and the second N-type diffusion region.

13. The circuit of claim 8, wherein:
the diffusion break is not disposed between the first P-type diffusion region and the second P-type diffusion region; and
the diffusion break is disposed between the first N-type diffusion region and the second N-type diffusion region.

14. The circuit of claim 8, wherein:
the diffusion break is disposed between the first P-type diffusion region and the second P-type diffusion region; and
the diffusion break is disposed between the first N-type diffusion region and the second N-type diffusion region.

15. The circuit of claim 1, wherein:
the at least one first gate comprises a plurality of first gates each having a longitudinal axis in the second direction and disposed above the at least one first semiconductor channel structure, and each separated from each other by a first gate pitch; and
the at least one second gate comprises a plurality of second gates each having a longitudinal axis in the second direction and disposed above the at least one second semiconductor channel structure, and each separated from each other by a second gate pitch.

16. The circuit of claim 1, wherein:
the substrate is formed from a first semiconductor material;
the at least one first semiconductor channel structure is formed from a second semiconductor material different from the first semiconductor material; and
the at least one second semiconductor channel structure is formed from a third semiconductor material different from the first semiconductor material.

17. The circuit of claim 16, wherein:
the first semiconductor material comprises Silicon (Si);
the second semiconductor material comprises Silicon Germanium (SiGe); and
the third semiconductor material comprises SiGe.

18. The circuit of claim 1, further comprising:
a source in a first end portion of the at least one first semiconductor channel structure; and
a drain in a second end portion of the at least one first semiconductor channel structure opposite of the first end portion.

19. The circuit of claim 18, further comprising a Fin Field-Effect Transistor (FET) (FinFET) comprising a first semiconductor channel structure among the at least one first semiconductor channel structure, the source in the first end portion of the at least one first semiconductor channel structure, the drain in the second end portion of the at least one first semiconductor channel structure, and an active gate of a gate of the at least one first gate disposed above the at least one first semiconductor channel structure adjacent to the source and the drain.

20. The circuit of claim 18, further comprising a gate-all-around (GAA) Field-Effect Transistor (FET) (GAA FET) comprising a first semiconductor channel structure among the at least one first semiconductor channel structure, the source in the first end portion of the at least one first semiconductor channel structure, the drain in the second end portion of the at least one first semiconductor channel structure, and an active gate of a gate of the at least one first gate disposed around the at least one first semiconductor channel structure adjacent to the source and the drain.

21. The circuit of claim 1 integrated into an integrated circuit (IC).

22. The circuit of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

23. The circuit of claim 1, wherein:
the substrate induces a first strain in at least a portion of the at least one first semiconductor channel structure; and
the substrate induces a second strain in at least a portion of the at least one second semiconductor channel structure.

24. The circuit of claim 23, wherein the first strain is at least 1 gigapascal (GPa), and the second strain is at least 1 GPa.

25. The circuit of claim 23, wherein the first strain is between 1 gigapascal (GPa) and 3 GPa, and the second strain is between 1 GPa and 3 GPa.

* * * * *